United States Patent
Taguchi

(10) Patent No.: US 8,383,302 B2
(45) Date of Patent: Feb. 26, 2013

(54) COLORED CURABLE COMPOSITION, COLOR FILTER AND PRODUCTION METHOD THEREOF, AND SOLID-STATE IMAGING DEVICE

(75) Inventor: Hiroshi Taguchi, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 642 days.

(21) Appl. No.: 12/561,297

(22) Filed: Sep. 17, 2009

(65) Prior Publication Data

US 2010/0081070 A1   Apr. 1, 2010

(30) Foreign Application Priority Data

Sep. 29, 2008 (JP) .................................. 2008-251379

(51) Int. Cl.
*G02B 5/20* (2006.01)
(52) U.S. Cl. ....... 430/7; 430/270.1; 430/288.1; 257/440
(58) Field of Classification Search .................. None
See application file for complete search history.

(56) References Cited

U.S. PATENT DOCUMENTS
2008/0081270 A1 * 4/2008 Tanaka ............................ 430/7

FOREIGN PATENT DOCUMENTS

| EP | 1975701 A | | 10/2008 |
|---|---|---|---|
| JP | 50-006034 B | | 3/1975 |
| JP | 2000-035670 A | | 2/2000 |
| JP | 2001-154011 A | | 6/2001 |
| JP | 2007-034119 A | | 2/2007 |
| JP | 2007-192892 | | 8/2007 |
| JP | 2009-151274 A | * | 7/2009 |
| WO | 2009/116442 A | | 9/2009 |

OTHER PUBLICATIONS

Computer-generated translation of JP 2009-151274 (Jul. 2009).*
Corresponding EPO Official communication.
English language translation of the following: Office action dated Nov. 9, 2012 from the Korean Patent Office in a Korean patent application corresponding to the instant patent application. This office action translation is submitted now in order to supplement the understanding of patent document JP 2007-192892 which is cited in the office action and is being disclosed in the instant Information Disclosure Statement.

* cited by examiner

*Primary Examiner* — John A. McPherson
(74) *Attorney, Agent, or Firm* — SOLARIS Intellectual Property Group, PLLC

(57) ABSTRACT

A colored curable composition is provided which has desired transmittance properties, has stability in a state of a chemical solution such as dispersion uniformity or long-term viscosity stability, is excellent in developing properties and is capable of forming a color pattern with high resolving power. The colored curable composition includes (A) a monomer having an alkyleneoxy chain, (B) a binder polymer, (C) a photopolymerization initiator, and (D) Pigment Red 166.

12 Claims, 1 Drawing Sheet

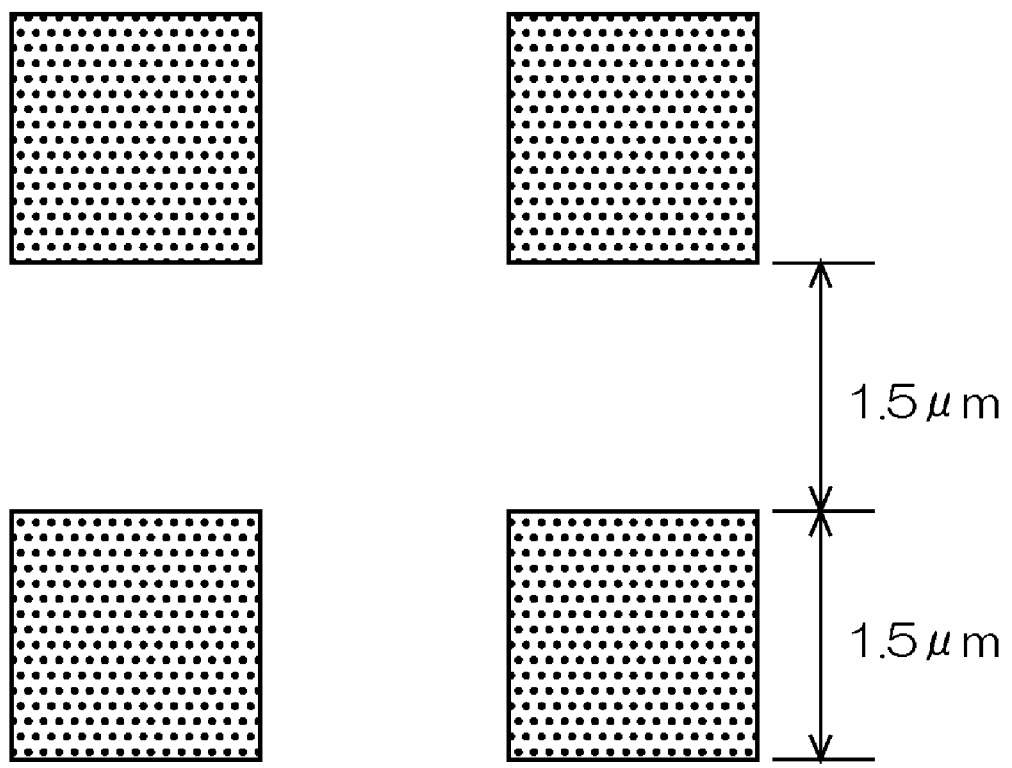

COLORED CURABLE COMPOSITION, COLOR FILTER AND PRODUCTION METHOD THEREOF, AND SOLID-STATE IMAGING DEVICE

CROSS-REFERENCE TO RELATED APPLICATION

This application claims priority under 35 USC 119 from Japanese Patent Application No. 2008-251379 filed on Sep. 29, 2008, the disclosure of which is incorporated by reference herein.

BACKGROUND OF THE INVENTION

1. Field of the Invention

The present invention relates to a colored curable composition, a color filter and a production method thereof, and a solid-state imaging device.

2. Description of the Related Art

Color filters are an indispensable part of liquid crystal displays (LCDs) and solid-state imaging devices.

These color filters have color patterns of multiple hues and usually have colored regions of at least red, green and blue colors (hereinafter, also called "color patterns" or "colored pixels"). A method for forming such a color filter is as follows. First, a curable composition containing any one of red, green and blue colorants is applied by coating to provide a first hue, and the curable composition is then exposed to light and developed, and subjected to a heat treatment as needed, to form a color pattern having the first hue. Next, similar coating, exposure and development processes, and a heat treatment as needed, are repeated with respect to a second hue and a third hue, respectively.

Recently, for both liquid crystal displays and solid-state imaging devices, the formation of fine color patterns (for example, color patterns having a side of 2.0 μm or less) with good reproducibility is demanded to improve resolving power, and a reduction in the thickness of a thin film of a color pattern (for example, to 1 μm or less) is also demanded.

In solid-state imaging devices that use a color filter having the aforementioned fine color patterns, color reproducibility and noise caused by color mixing are problematic, and, it is known that, particularly in a red filter, a local increase in transmittance near 530 nm causes degradation of image quality.

In order to suppress the local increase in transmittance near 530 nm, a technique of using Pigment Orange 38 (PO 38) or the like has been developed (see, for example, Japanese Patent Application Lai-Open (JP-A) No. 2001-154011).

However, even when the technique described in JP-A No. 2001-154011 is used, it is not possible to form a pattern with a small area having a side of 2.0 μm or less, and achieve dispersion uniformity and stable long term viscosity of a composition.

Accordingly, in the field of colored curable compositions, a curable composition is desired which imparts transmittance to color filters, in particular, color filters for solid-state imaging devices, and which has excellent dispersion uniformity, long-term viscosity stability, and good development properties, and is suitable for forming images having a small area.

BRIEF DESCRIPTION OF THE DRAWINGS

FIG. 1 shows the mask pattern of a photomask used for pattern exposure in one exemplary embodiment of the present invention.

SUMMARY OF THE INVENTION

According to an aspect of the invention, there is provided a colored curable composition that has desired transmittance properties, has favorable stability such as dispersion uniformity or long-term viscosity stability when in a state of a chemical solution, has excellent developing properties and is capable of forming a color pattern with high resolving power, and in particular, a colored curable composition useful for forming colored regions of a color filter is provided.

According to further aspects of the invention, a color filter having colored regions with high resolving power, a method for producing the same, and a solid-state imaging device having a color filter with excellent color properties (color reproducibility) are provided.

As the result of extensive studies, the inventors of the present invention have completed the invention by using a specific monomer and a specific pigment in combination.

<1> A colored curable composition, including:
a monomer having an alkyleneoxy chain;
a binder polymer;
a photopolymerization initiator; and
a pigment including Pigment Red 166.

<2> The colored curable composition according to <1>, wherein the pigment including Pigment Red 166 further includes Pigment Red 224.

<3> The colored curable composition according to <1>, wherein the pigment including Pigment Red 166 further includes a yellow pigment.

<4> The colored curable composition according to <2>, wherein the pigment including Pigment Red 166 further includes a yellow pigment.

<5> The colored curable composition according to <3>, wherein the yellow pigment is Pigment Yellow 139.

<6> The colored curable composition according to <4>, wherein the yellow pigment is Pigment Yellow 139.

<7> The colored curable composition according to <1>, wherein the monomer having an alkyleneoxy chain includes 3 to 30 photocurable functional groups.

<8> The colored curable composition according to <7>, wherein each of the photocurable functional groups is a group having photo-radical reactivity.

<9> The colored curable composition according to <1>, wherein the monomer having an alkyleneoxy chain further includes an acidic functional group.

<10> The colored curable composition according to <9>, wherein the acidic functional group is a carboxyl group, a sulfonic acid group, or a phosphoric acid group.

<11> A color filter, which is produced using the colored curable composition according to <1>.

<12> A method of producing a color filter, including:
applying the colored curable composition according to <1> to form a colored layer;
exposing the colored layer to light; and
developing the colored layer after the exposure.

<13> A solid-state imaging device, including the color filter according to <11>.

DETAILED DESCRIPTION OF THE INVENTION

Colored Curable Composition

The colored curable composition of the present invention includes (A) a monomer having an alkyleneoxy chain, (B) a binder polymer, (C) a photopolymerization initiator, and (D) a pigment including Pigment Red 166.

By making the colored curable composition have the formulation above, it is possible to suppress a local increase in transmittance near 530 nm, thus imparting desired transmittance properties, and obtaining long-term viscosity stability and resolving power.

The colored curable composition of the invention can be used for producing a red color pattern in which a local increase in transmittance near 530 nm is suppressed. A solid-state imaging device having a color filter including three or more colors including the red color pattern, a blue color pattern, and a green color pattern is excellent in, in particular, color reproducibility of a flesh color (skin color).

Hereinafter, respective constituents used in the colored curable composition of the invention will be described in turn.

(A) Monomer Having Alkyleneoxy Chain

The colored curable composition of the invention includes at least (A) one monomer (hereinafter, also referred to as a "specific monomer") having an alkyleneoxy chain (hereinafter, also referred to as an "AO chain") as an indispensable constituent.

As the specific monomer of the invention, a compound having a photocurable functional group and a comparatively small molecular size is preferably used. Particularly, use of a compound having a weight average molecular weight of less than 3,000 in terms of polystyrene is preferable.

When the specific monomer is combined with a colored curable composition, a cross-linking density is increased owing to a photocurable functional group of the monomer, and hydrophilicity is improved owing to an alkyleneoxy chain of the monomer; thus, the solubility of the composition in an aqueous alkali developer is improved. Consequently, even when the amount of a component having no curing reactivity and no alkali solubility, such as a colorant or a photopolymerization initiator, is increased in the colored curable composition, the addition of the specific monomer having an alkyleneoxy chain can improve the cross-linking density and alkali solubility; thus providing excellent curing properties and alkali developability.

The specific monomer may have an acidic functional group in addition to the alkyleneoxy chain.

When a specific monomer additionally having an acidic functional group is blended to the colored curable composition, the cross-linking density is increased owing to the photocurable functional group of the monomer, and the acidic functional group of the monomer increases the alkali solubility of the composition. Consequently, even when the amount of a component having no curing reactivity and no alkali solubility, such as a colorant or a photopolymerization initiator, is increased in the colored curable composition, the addition of the specific monomer additionally having an acidic functional group improves the cross-linking density and alkali solubility; thus, excellent curing properties and alkali developability are provided.

The acidic functional group of the specific monomer may be one that enables alkali development. Examples thereof include a carboxyl group, a sulfonic acid group, and a phosphoric acid group. From standpoints of alkali developability and handling properties of a resin composition, a carboxyl group is preferable.

The reaction system of the photocurable functional group of the specific monomer is not limited, and may be either of a photo-radical reaction, a photo-cationic reaction, and a photo-anionic reaction. The photocurable functional group is preferably a group having photo-radical reactivity such as photo-radical polymerization or photo-radical dimerization. Particularly, it is preferably a group containing an ethylenically unsaturated bond such as a (meth)acryloyl group. The photocurable functional group is preferably an acryloyl group or a methacryloyl group, and further preferably an acryloyl group.

In order to increase the cross-linking density, a larger number of photocurable functional groups of the specific monomer is desirable.

From a standpoint of the cross-linking density, the number of the photocurable functional groups in the specific monomer having an AO chain is preferably 3 or more, more preferably from 3 to 30, and particularly preferably from 3 to 15.

Also, from a standpoint of the cross-linking density, the number of photocurable functional groups in the specific monomer additionally having an acidic functional group is preferably 3 or more.

From a standpoint of more effectively obtaining the effects of the invention, the specific monomer is preferably a pentaerythritol derivative or a dipentaerythritol derivative.

As the specific monomer additionally having an acidic functional group, (1) a monomer obtained by modifying a monomer or oligomer having a hydroxyl group and three or more photocurable functional groups with a dibasic acid anhydride to introduce a carboxyl group, or (2) a monomer obtained by modifying an aromatic compound having three or more photocurable functional groups with concentrated sulfuric acid or fuming sulfuric acid to introduce a sulfonic acid group, and the like may be employed. Further, an oligomer having, as a repeating unit, a monomer that is the specific monomer itself may be used as the specific monomer.

The specific monomer used in the invention is preferably at least one selected from the group consisting of compounds represented by the following formula (1) and formula (2). Meanwhile, in Formulae (1) and (2), when T or G is an alkyleneoxy chain, an end at the carbon atom side of the alkyleneoxy group is linked to R, X or W.

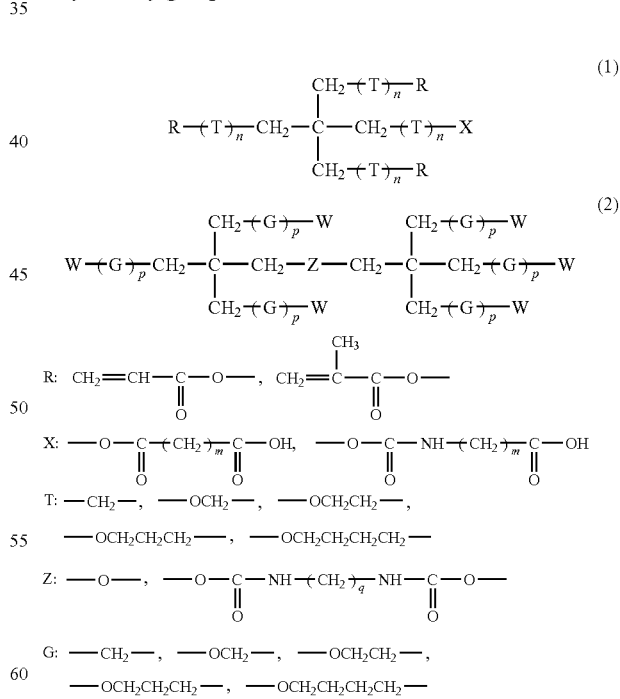

In Formula (1), n represents an integer of from 0 to 14, and m represents an integer of from 1 to 8. In Formula (2), W is identical to R or X in Formula (1), and 3 or more Ws of the 6 Ws are identical to R; p represents an integer of from 0 to 14; and q represents an integer of from 1 to 8. More than one R, T, G or W may exist in one molecule, and R, T, G or W may be the same as or different from one another.

Among the compounds represented by Formula (1) or (2), pentaerythritol derivatives and/or dipentaerythritol derivatives are more preferable.

Specifically, compounds represented by the following Formulae (3) to (14) (hereinafter, also referred to as "Exemplified Compounds (3) to (14)") are given herein. Among these, Exemplified Compounds (3), (4), (5), (7) and (9) are preferable.

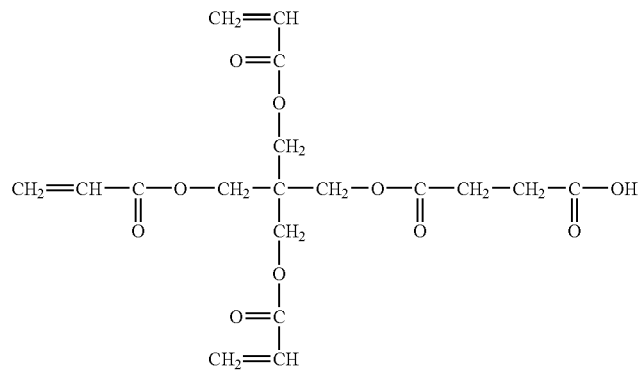
(3)

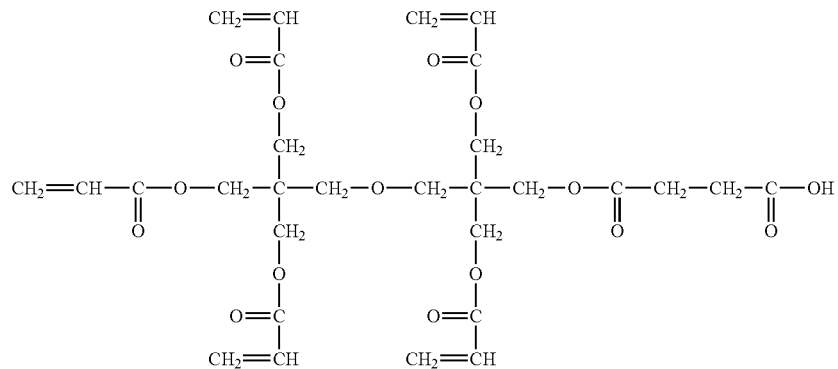
(4)

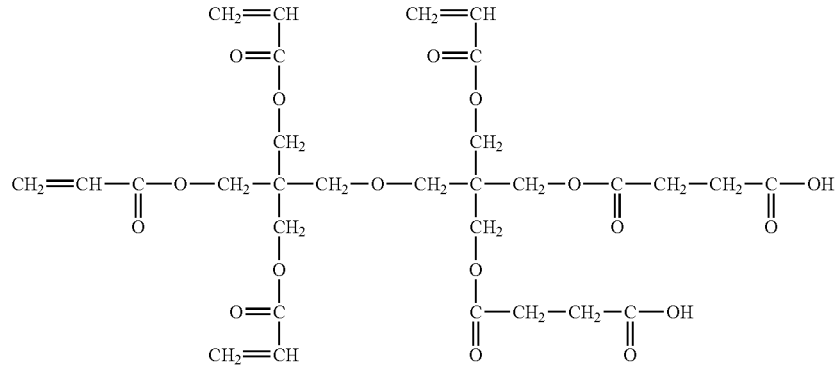
(5)

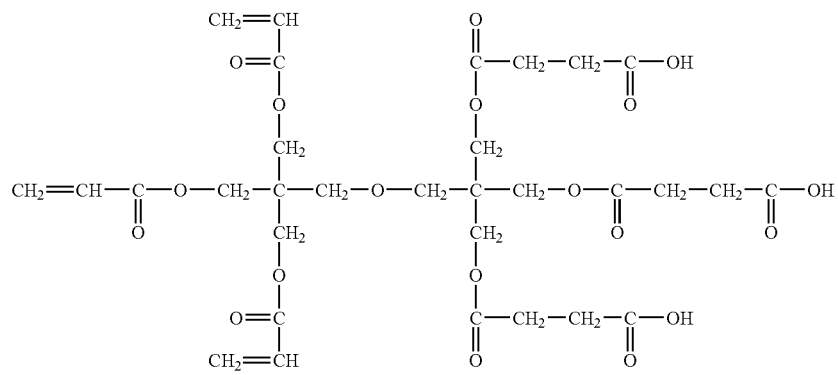
(6)

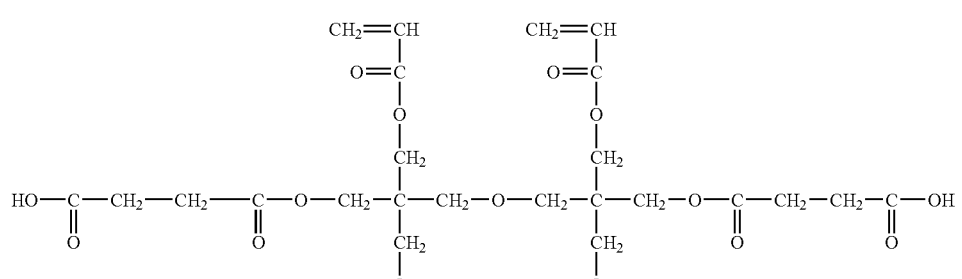
(7)
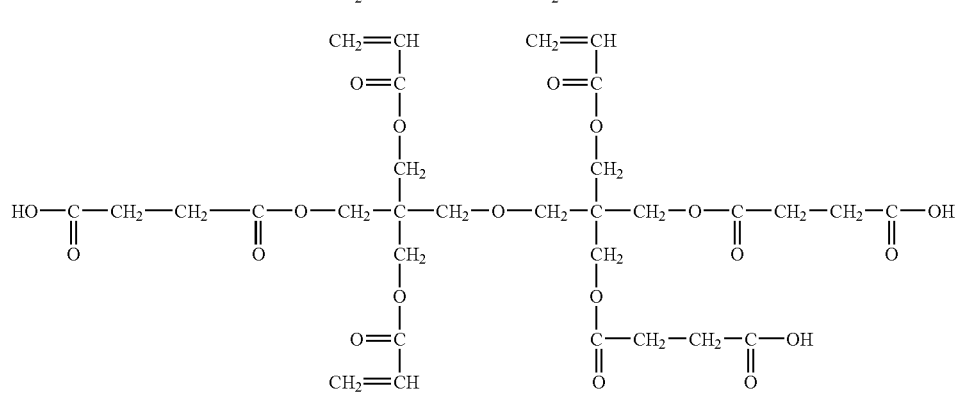
(8)
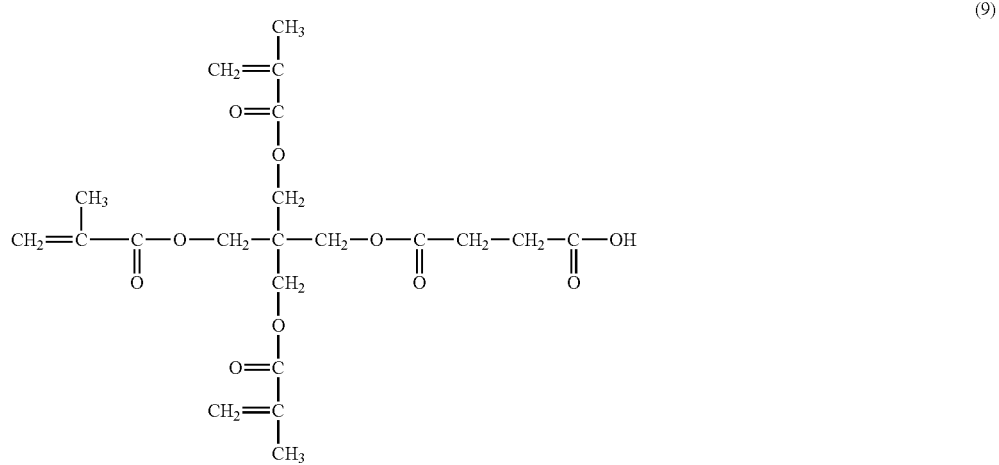
(9)
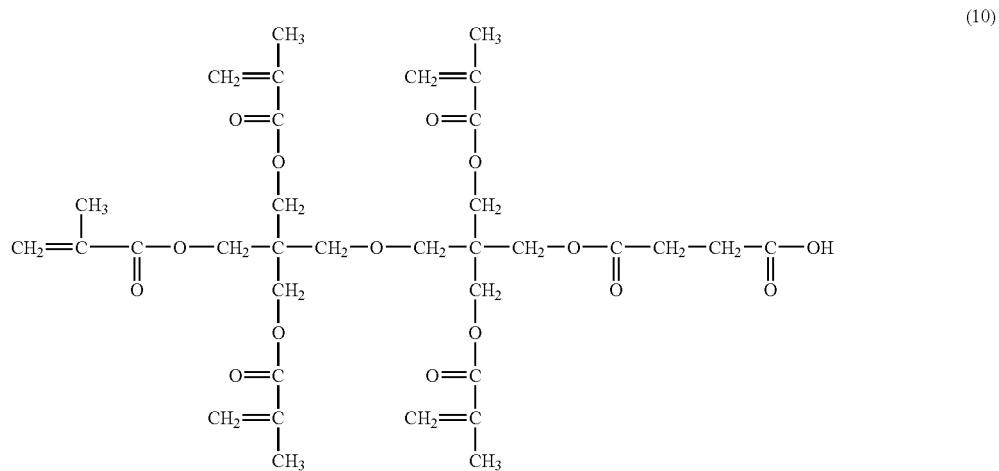
(10)

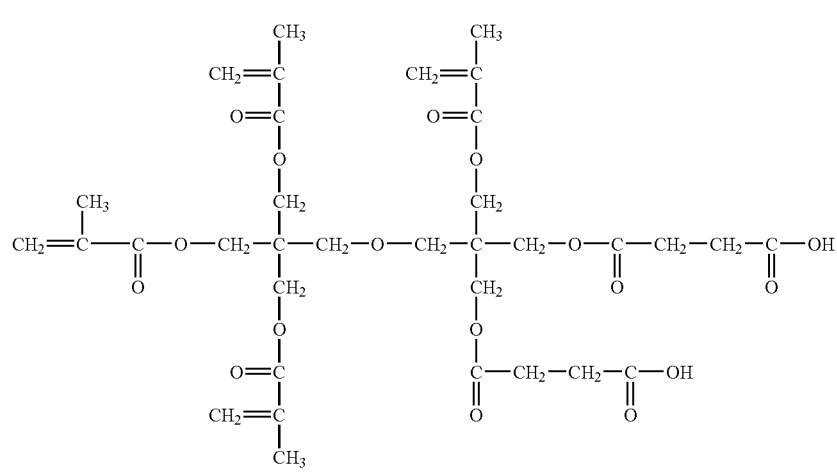
(11)
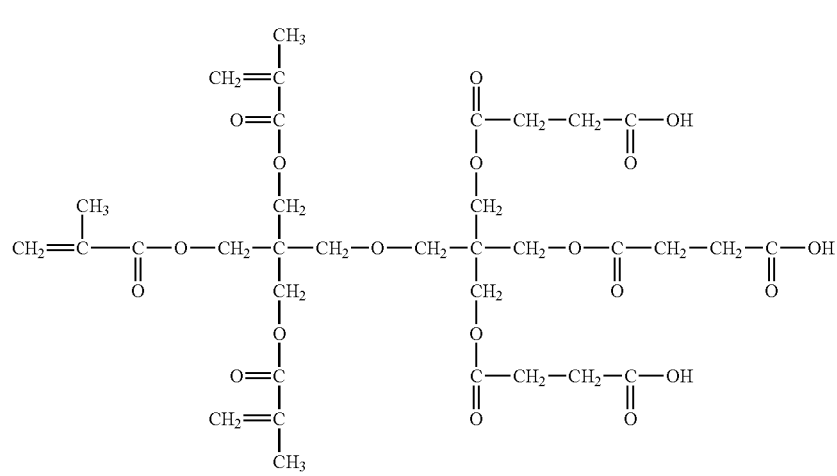
(12)
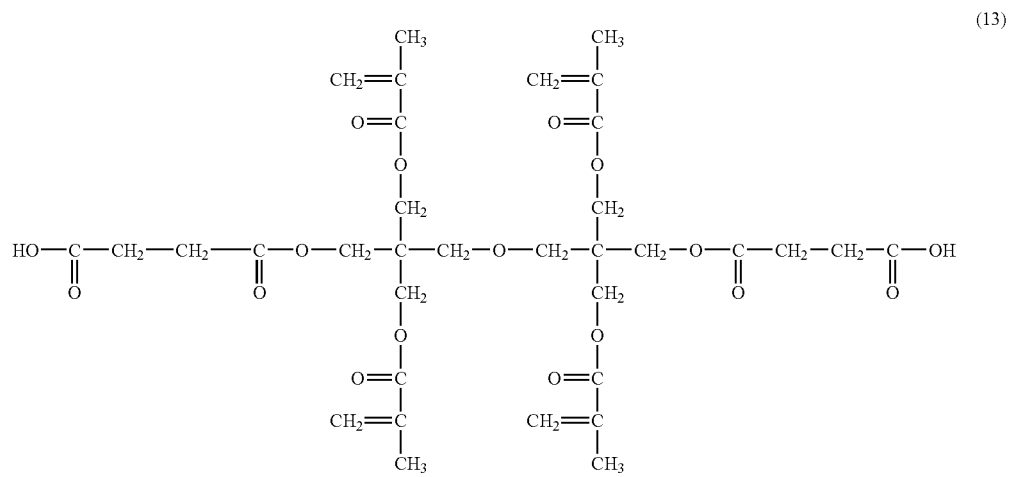
(13)

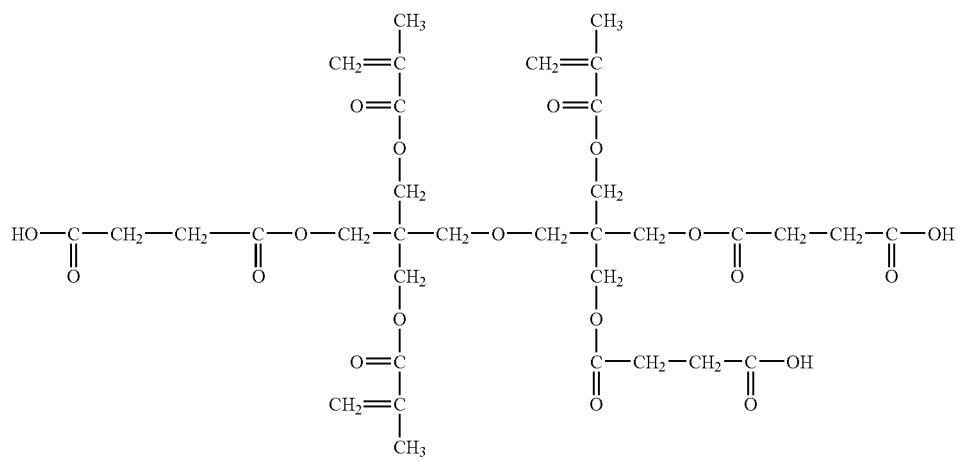

(14)

Examples of commercially-available products of the specific monomer represented by Formula (1) or (2) include TO-756 that is a carboxyl group-containing trifunctional acrylate, and TO-1382 that is a carboxyl group-containing pentafunctional acrylate (both trade names, manufactured by To a Gosei Co., Ltd.).

Further, the specific monomer in the invention may also be at least one selected from the group consisting of compounds represented by the following Formula (i) and (ii).

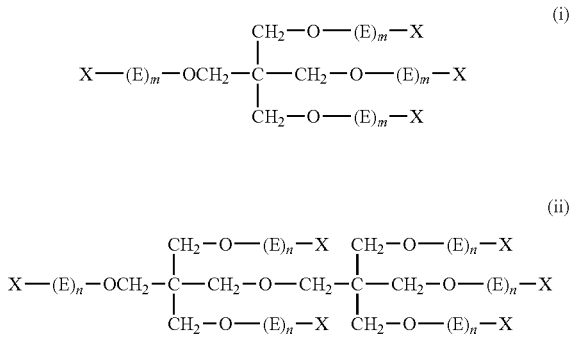

In Formulae (i) and (ii), each E independently represents —(($CH_2$)$_y$$CH_2$O)— or —(($CH_2$)$_y$CH($CH_3$)O)—, in which each "y" independently represents an integer of from 0 to 10; and each X independently represents an acryloyl group, a methacryloyl group, a hydrogen atom or a carboxyl group.

In Formula (i), the total number of the acryloyl group and the methacryloyl group is 3 or 4, each "m" independently represents an integer of from 0 to 10, and the sum of the numbers represented by plural "m"s is an integer of from 0 to 40, provided that when the sum of the numbers represented by plural "m"s is 0, one X is a carboxyl group.

In Formula (ii), the total number of the acryloyl groups and the methacryloyl groups is 5 or 6, each "n" independently represents an integer of from 0 to 10, and the sum of the numbers represented by plural "n"s is an integer of from 0 to 60, provided that when the sum of the numbers represented by plural "n"s is 0, one X is a carboxyl group.

In Formula (i), m is preferably an integer of from 0 to 6, and more preferably an integer of from 0 to 4. The sum of the numbers of plural "m"s is preferably an integer of from 2 to 40, more preferably an integer of from 2 to 16, and particularly preferably an integer of from 4 to 8.

In Formula (ii), n is preferably an integer of from 0 to 6, and more preferably an integer of from 0 to 4. The sum of the numbers of plural "n"s is preferably an integer of from 3 to 60, more preferably an integer of from 3 to 24, and particularly preferably an integer of from 6 to 12.

Further, in Formula (i) or Formula (ii), it is preferable that the end at the oxygen atom side of —(($CH_2$)$_y$$CH_2$O)— or —(($CH_2$)$_y$CH($CH_3$)O)— is linked to X.

The compounds represented by Formula (i) or (ii) may be used singly, or in combination of two or more thereof. Particularly, it is preferable that in Formula (ii), all of six Xs each represent an acryloyl group.

The total amount of the compounds represented by Formulae (i) and (ii) in the specific monomer is preferably 20% by mass or more, and more preferably 50% by mass or more.

The compound represented by Formula (i) or (ii) may be synthesized by a process of subjecting pentaerythritol or dipentaerythritol to a ring-opening addition reaction with ethylene oxide or propylene oxide to bond a ring-opened skeleton, and a process of reacting, for example, (meth)acryloyl chloride with the terminal hydroxyl group of the ring-opened skeleton to introduce a (meth)acryloyl group, which are conventionally known processes. Respective processes are well-known, and a person skilled in the art may easily synthesize a compound represented by Formula (i) or (ii).

Among the compounds represented by Formulae (i) and (ii), pentaerythritol derivatives and/or dipentaerythritol derivatives are more preferable.

Specifically, compounds represented by the following Formulae (a) to (f) (hereinafter, also referred to as "Exemplified Compounds (a) to (f)") are mentioned. Among them, Exemplified Compounds (a), (b), (e) and (f) are preferable.

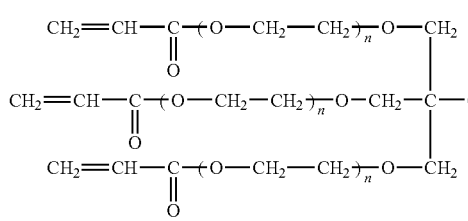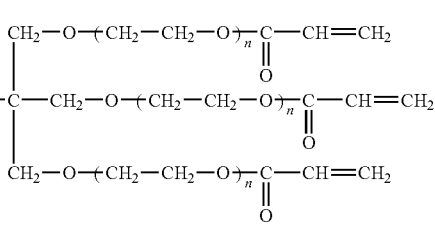

(a)

(The sum of the numbers represented by plural "n"s is 6.)

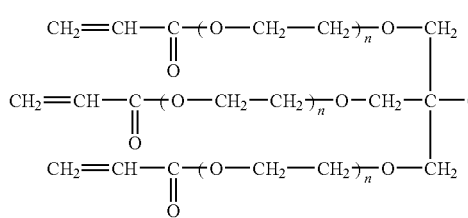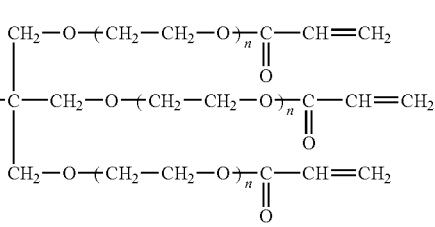

(b)

(The sum of the numbers represented by plural "n"s is 12.)

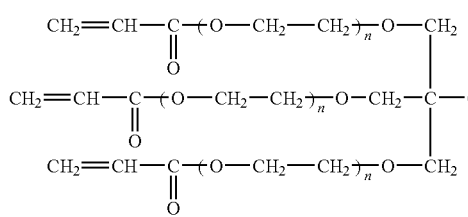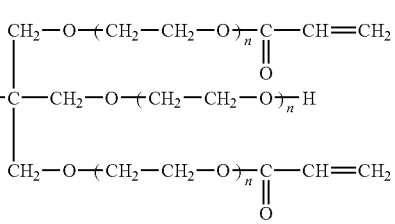

(c)

(The sum of the numbers represented by plural "n"s is 12.)

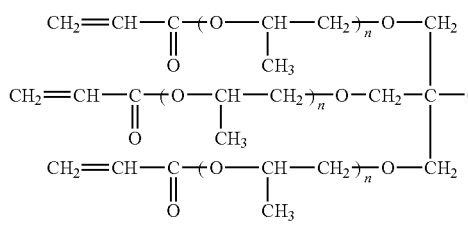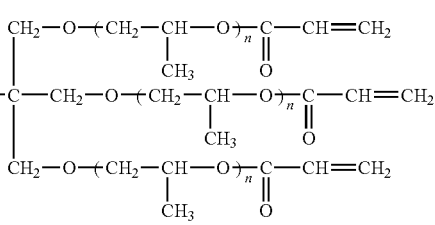

(d)

(The sum of the numbers represented by plural "n"s is 6.)

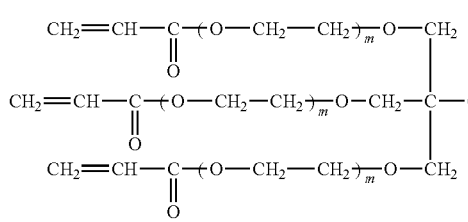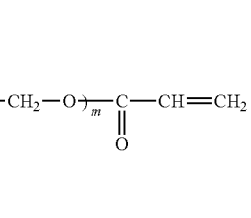

(e)

(The sum of the numbers represented by plural "n"s is 4.)

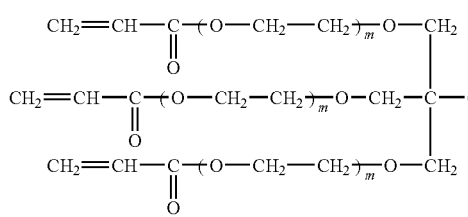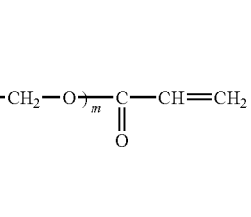

(f)

(The sum of the numbers represented by plural "n"s is 12.)

Examples of commercially-available products of the specific monomers represented by Formulae (i) and (ii) include SR-494 that is a tetrafunctional acrylate having four ethyleneoxy chains (trade name, manufactured by Sartomer Co., Ltd.), DPCA-60 that is a hexafunctional acrylate having six pentyleneoxy chains, and TPA-330 that is a trifunctional acrylate having three isobutyleneoxy chains (both trade names, manufactured by Nippon Kayaku Co., Ltd.).

In the colored curable composition of the invention, another photopolymerizable compound having two or more photopolymerizable functional groups may further be blended in addition to the specific monomer. As compared with the specific monomer that increases both the cross-linking density and the alkali solubility, "another photopolymerizable compound having two or more photopolymerizable functional groups" increases only the cross-linking density. Therefore, by combining these, both the cross-linking density and the alkali solubility may be adjusted.

Examples of "another photopolymerizable compound having two or more photopolymerizable functional groups" include monofunctional acrylates and monofunctional methacrylates, such as polyethylene glycol mono(meth)acrylate, polypropylene glycol mono(meth)acrylate or phenoxyethyl (meth)acrylate; and polyfunctional acrylates and polyfunctional methacrylates, such as compounds obtained by adding ethylene oxide or propylene oxide to a polyfunctional alcohol such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol (meth)acrylate, trimethylolpropane tri(acryloyloxypropyl) ether, tri(acryloyloxyethyl)isocyanurate, glycerin or trimethylolethane and then modifying the resultant product with (meth)acrylate, urethane acrylates such as those described in Japanese patent publication (JP-B) No. 48-41708 or 50-6034 or JP-A No. 51-37193, polyester acrylates such as those described in JP-A No. 48-64183 or JP-B No. 49-43191 or 52-30490, and epoxy acrylates which are reaction products of an epoxy resin and (meth)acrylic acid.

Further, those described as photocurable monomers and oligomers in Journal of Adhesion Society of Japan Vol. 20, No. 7 (pp. 300-308) may also be used.

The amount of (A) the specific monomer in the colored curable composition of the invention is preferably from 2 to 50% by mass, more preferably from 2 to 30% by mass, and furthermore preferably from 2 to 15% by mass, with respect to the total solid content of the composition. When the amount is within the range, a larger amount of a pigment may be included in the colored curable composition without damaging the effect of the invention, which enables further thickness reduction and further size reduction of patterns.

(B) Binder Polymer

The colored curable composition of the invention includes at least one binder polymer.

Although the binder polymer is not particularly limited, linear organic high-molecular weight polymers which are soluble in an organic solvent, and enables development with a slightly alkaline aqueous solution are preferable. Examples of the linear organic high-molecular weight polymers include polymers having a carboxylic acid in a side chain thereof, such as methacrylic acid copolymers, acrylic acid copolymers, itaconic acid copolymers, crotonic acid copolymers, maleic acid copolymers or partially esterified maleic acid copolymers as those described in JP-A No. 59-44615, JP-B No. 54-34327, 58-12577 or 54-25957, or JP-A No. 59-53836 or 59-71048, and acidic cellulose derivatives having carboxylic acid on the side chain thereof. In addition, products obtained by adding an acid anhydride to a polymer having a hydroxyl group are also useful. Particularly, among these, benzyl(meth)acrylate/(meth)acrylic acid copolymer, and multicomponent copolymers of benzyl(meth)acrylate/(meth) acrylic acid/another monomer are suitable. In addition, a water-soluble polymer such as 2-hydroxyethyl methacrylate, polyvinyl pyrrolidone, polyethylene oxide, polyvinyl alcohol, or the like is also useful.

Further, examples of the binder polymer further include 2-hydroxypropyl(meth)acrylate/polystyrene macromonomer/benzyl methacrylate/methacrylic acid copolymer, 2-hydroxy-3-phenoxypropyl acrylate/polymethyl methacrylate macromonomer/benzyl methacrylate/methacrylic acid copolymer, 2-hydroxyethyl methacrylate/polystyrene macromonomer/methyl methacrylate/methacrylic acid copolymer, 2-hydroxyethyl methacrylate/polystyrene macromonomer/benzyl methacrylate/methacrylic acid copolymer, and the like such as those described in JP-A No. 7-140654.

The amount of the binder polymer in the colored curable composition is preferably from 5 to 90% by mass, and more preferably from 10 to 60% by mass, with respect to the total mass of the composition.

The amount of the binder polymer relative to the total solid content of the colored curable composition is preferably from 20 to 60% by mass, and more preferably from 10 to 40% by mass.

The "total solid content" as used in the invention refers to all of the components of the composition, except the solvent.

When the amount falls within the range, the amount of a pigment included in the composition may further be increased without damaging the effect of the invention, which enables further thickness reduction and further size reduction of patterns.

(C) Photopolymerization Initiator

The colored curable composition of the invention includes at least one photopolymerization initiator. The photopolymerization initiator is a compound that is decomposed by light to initiate and accelerate the polymerization of the specific monomer or the like, and preferably absorbs light within a wavelength region from 300 to 500 nm.

The photopolymerization initiator may be used singly, or a combination of two or more photopolymerization initiators may be used.

Examples of the photopolymerization initiator include organic halogenated compounds, oxadiazole compounds, carbonyl compounds, ketal compounds, benzoin compounds, acridine compounds, organic peroxide compounds, azo compounds, coumarin compounds, azide compounds, metallocene compounds, hexaaryl biimidazole compounds, organic borate compounds, disulfone compounds, oxime compounds, onium salt compounds, acylphosphine compounds, and alkylamino compounds.

Hereinafter, these compounds, respectively, are described in detail.

Specific examples of the organic halogenated compounds include compounds such as those described in Wakabayashi et. al. "Bull Chem. Soc Japan" 42, 2924 (1969), U.S. Pat. No. 3,905,815, JP-B No. 46-4605, JP-A No. 48-36281, 55-32070, 60-239736, 61-169835, 61-169837, 62-58241, 62-212401, 63-70243 or 63-298339, M. P. Hutt "Journal of Heterocyclic Chemistry" 1 (No 3), (1970), or the like. Particularly, oxazole compounds substituted by a trihalomethyl group, and s-triazine compounds are mentioned.

As examples of the s-triazine compounds, s-triazine derivatives in which at least one mono-, di- or tri-halogen-substituted methyl group is bonded to an s-triazine ring are mentioned. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis (trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the oxadiazole compounds include 2-trichloromethyl-5-styryl-1,3,4-oxodiazole, 2-trichloromethyl-5-(cyanostyryl)-1,3,4-oxodiazole, 2-trichloromethyl-5-(naphtho-1-yl)-1,3,4-oxodiazole, and 2-trichloromethyl-5-(4-styryl)styryl-1,3,4-oxodiazole.

Examples of the carbonyl compounds include benzophenone and benzophenone derivatives such as Michler's ketone, 2-methylbenzophenone, 3-methylbenzophenone, 4-methylbenzophenone, 2-chlorobenzophenone, 4-bromobenzophenone, or 2-carboxybenzophenone; acetophenone derivatives such as 2,2-dimethoxy-2-phenylacetophenone, 2,2-diethoxyacetophenone, 1-hydroxycyclohexyl phenyl ketone, α-hydroxy-2-methylphenyl propanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone, 1,1,1-trichloromethyl-(p-butylphenyl) ketone, or 2-benzyl-2-dimethylamino-4-morpholinobutylphenone; thioxanthone and thioxanthone derivatives such as 2-ethylthioxantone, 2-isopropylthioxantone, 2-chlorothioxantone, 2,4-dimethylthioxantone, 2,4-diethylthioxantone, or 2,4-diisopropyl thioxanthone; benzoic acid ester derivatives such as ethyl p-dimethylaminobenzoate or ethyl p-diethylaminobenzoate.

Examples of the ketal compounds include benzyl methyl ketal and benzyl-β-methoxyethyl ethyl acetal.

Examples of the benzoin compounds include m-benzoin isopropyl ether, benzoin isobutyl ether, benzoin methyl ether, and methyl-o-benzoyl benzoate.

Examples of the acridine compounds include 9-phenyl acridine and 1,7-bis(9-acridinyl)heptane.

Examples of the organic peroxide compounds include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl di(t-butylperoxydihydrogen diphthalate), and carbonyl di(t-hexylperoxydihydrogen diphthalate).

Examples of the azo compounds include azo compounds such as those described in JP-A No. 8-108621.

Examples of the coumarin compounds include 3-methyl-5-amino-((s-triazine-2-yl)amino)-3-phenylcoumarin, 3-chloro-5-diethylamino-((s-triazine-2-yl)amino)-3-phenylcoumarin, and 3-butyl-5-dimethylamino-((s-triazine-2-yl)amino)-3-phenylcoumarin.

Examples of the azide compounds include organic azide compounds such as those described in U.S. Pat. No. 2,848,328, 2,852,379 or 2,940,853, and 2,6-bis(4-azidebenzylidene)-4-ethylcyclohexanone (BAC-E).

Examples of the metallocene compounds include various titanocene compounds such as those described in JP-A No. 59-152396, 61-151197, 63-41484, 2-249, 2-4705 or 5-83588, for example, dicyclopentadienyl-Ti-bis-phenyl, dicyclopentadienyl-Ti-bis-2,6-difluorophenyl-1-yl, dicyclopentadienyl-Ti-bis-2,4-difluorophenyl-1-yl, dicyclopentadienyl-Ti-bis-2,4,6-trifluorophenyl-1-yl, dicyclopentadienyl-Ti-bis-2,3,5,6-tetrafluorophenyl-1-yl, dicyclopentadienyl-Ti-bis-2,3,4,5,6-pentafluorophenyl-1-yl, dimethylcyclopentadienyl-Ti-bis-2,6-difluorophenyl-1-yl, dimethylcyclopentadienyl-Ti-bis-2,4,6-trifluorophenyl-1-yl, dimethylcyclopentadienyl-Ti-bis-2,3,5,6-tetrafluorophenyl-1-yl, or dimethylcyclopentadienyl-Ti-bis-2,3,4,5,6-pentafluorophenyl-1-yl, and iron-arene complexes such as those described in JP-A No. 1-304453 or 1-152109.

Examples of the hexaaryl biimidazole compounds include various compounds such as those described in JP-B No. 6-29285, U.S. Pat. No. 3,479,185, 4,311,783 or 4,622,286. Specific examples thereof include 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole, and 2,2'-bis(o-trifluorophenyl)-4,4',5,5'-tetraphenyl biimidazole.

Examples of the organic borate compounds include organic borates such as those described in various gazettes such as JP-A No. 62-143044, 62-150242, 9-188685, 9-188686, 9-188710, 2000-131837, 2002-107916, or 2002-116539, Japanese Patent No. 2764769, or Kunz, Martin "Rad Tech '98. Proceeding Apr. 19-22, 1998, Chicago"; organic boron sulfonium complexes or organic boron oxosulfonium complexes such as those described in JP-A Nos. 6-157623, 6-175564 or 6-175561; organic boron iodonium complexes such as those described in JP-A No. 6-175554 or 6-175553; organic boron phosphonium complexes such as those described in JP-A No. 9-188710; and organic boron transition metal-coordinated complexes such as those described in JP-A No. 6-348011, 7-128785, 7-140589, 7-306527, or 7-292014.

Examples of the disulfone compounds include compounds such as those described in JP-A No. 61-166544 or 2002-328465.

Examples of the oxime compounds include compounds such as those described in J. C. S. Perkin II (1979) 1653-1660, J. C. S. Perkin II (1979) 156-162, Journal of Photopolymer Science and Technology (1995) 202-232 or JP-A No. 2000-66385; and compounds such as those described in JP-A No. 2000-80068 or JP-A No. 2004-534797.

The oxime photopolymerization initiator is most preferably 2-(O-benzoyloxime)-1-[4-(phenylthio)phenyl]-1,2-octanedione or 1-(O-acetyloxime)-1-[9-ethyl-6-(2-methylbenzoyl)-9H-carbazol-3-yl]ethanone. As such oxime photopolymerization initiators, CGI-124 and CGI-242 (both trade names, manufactured by Ciba Specialty Chemicals) are mentioned.

Examples of the onium salt compounds include diazonium salts such as those described in S. I. Schlesinger, Photogr. Sci. Eng., 18, 387 (1974) or T. S. Bal et al, Polymer, 21, 423 (1980); ammonium salts such as those described in U.S. Pat. No. 4,069,055, JP-A No. 4-365049 or the like; phosphonium salts such as those described in U.S. Pat. No. 4,069,055 or 4,069,056; and iodonium salts such as those described in EP-A No. 104,143 or JP-A No. 2-150848 or 2-296514.

The iodonium salt that is favorably usable in the invention is a diaryl iodonium salt, and the diaryl iodonium salt is, from a standpoint of stability, preferably substituted by two or more electron-donating groups such as an alkyl group, an alkoxy group, or an aryloxy group.

Examples of sulfonium salts that are favorably used in the invention include sulfonium salts such as those described in EP-A No. 370,693, 390,214, 233,567, 297,443 or 297,442, U.S. Pat. No. 4,933,377, 4,760,013, 4,734,444 or 2,833,827, or German Patent No. 2,904,626, 3,604,580 or 3,604,581. These sulfonium salts are preferably substituted by an electron-withdrawing group from standpoints of stability and sensitivity. The electron-withdrawing group preferably has a Hammett value of higher than 0. Examples of preferable electron-withdrawing groups include a halogen atom and a carboxylic acid.

In addition, examples of other preferable sulfonium salts include triaryl sulfonium in which one substituent thereof has a coumarin or anthraquinone structure, and which absorbs light at a wavelength of 300 nm or higher. As another preferable sulfonium salt, triaryl sulfonium salts having an aryloxy group or an arylthio group as a substituent and absorbing light at a wavelength of 300 nm or more are mentioned.

Examples of the onium salt compounds also include selenonium salts such as those described in J. V. Crivello et al, Macromolecules, 10(6), 1307 (1977) or J. V. Crivello et al, J. Polymer Sci. Polymer Chem. Ed., 17, 1047 (1979), and arsonium salts such as those described in C. S. Wen et al, Teh, Proc. Conf. Rad. Curing ASIA, p 478 Tokyo, October (1988).

Examples of the acylphosphine compounds include IRGA-CURE 819, DAROCURE 4265 and DAROCURE TPO (all trade names, manufactured by Ciba Specialty Chemicals).

Examples of the alkylamino compounds include compounds having a dialkylamino phenyl group and alkylamine compounds, such as those described in JP-A No. 9-281698, paragraph [0047], JP-A No. 6-19240 or 6-19249. Specific examples of the compound having a dialkylamino phenyl group include compounds such as ethyl p-dimethylaminobenzoate, and dialkylamino phenyl carbaldehyde such as p-diethylamino benzcarbaldehyde or 9-julolidyl carbaldehyde, and specific examples of the alkylamine compounds include triethanolamine, diethanolamine, and triethylamine.

The (C) photopolymerization initiator to be used in the invention is preferably a compound selected from the group consisting of triazine compounds, alkylamino compounds, benzyl dimethyl ketal compounds, α-hydroxyketone compounds, α-aminoketone compounds, acylphosphine compounds, phosphine oxide compounds, metallocene compounds, oxime compounds, biimidazole compounds, onium compounds, benzothiazole compounds, benzophenone compounds, acetophenone compounds and derivatives thereof, cyclopentadiene-benzen-iron complexes and salts thereof, halomethyloxadiazole compounds and 3-aryl-substituted coumarin compounds, from a standpoint of exposure sensitivity.

More preferable are triazine compounds, alkylamino compounds, α-aminoketone compounds, acylphosphine compounds, phosphine oxide compounds, oxime compounds, biimidazole compounds, onium compounds, benzophenone compounds, and acetophenone compounds, and furthermore preferable is at least one compound selected from the group consisting of triazine compounds, alkylamino compounds, oxime compounds, and biimidazole compounds.

The amount of (C) the photopolymerization initiator in the colored curable composition is preferably from 0.1 to 50% by mass, more preferably from 0.5 to 30% by mass, and particularly preferably from 1 to 20% by mass, with respect to the total solid content of the composition. Particularly, when the colored curable composition of the invention is used for forming color patterns of color filters, the amount of (C) the photopolymerization initiator is preferably from 1 to 40% by mass, more preferably from 2 to 30% by mass, and further preferably from 3 to 20% by mass, with respect to the total solid content of the colored curable composition, from the standpoints of photosensitivity, adhesiveness with supports and curing degree.

(D) Pigment Including Pigment Red 166

The colored curable composition of the invention includes (D) a pigment including Pigment Red 166.

Pigment Red 166 is a condensed azo pigment. In the present specification, Pigment Red 116 is also denoted by "C. I. Pigment Red 166", "CIPR 166", or "PR 166." Other pigments are also denoted in the same way.

In the colored curable composition of the invention, Pigment Red 166 and a pigment other than Pigment Red 166 may be used in combination.

Particularly, it is preferable that (D) the pigment including Pigment Red 166 further includes Pigment Red 224, to obtain the effects of the invention more effectively.

Further, it is also preferable that (D) the pigment including Pigment Red 166 further includes a yellow pigment (preferably Pigment Yellow 139), to obtain the effects of the invention more effectively.

It is particularly preferable that (D) the pigment including Pigment Red 166 further includes Pigment Red 224 and a yellow pigment (preferably Pigment Yellow 139).

Other pigments may be used in combination with Pigment Red 166 in the invention, and such pigments may be selected from various conventionally-known inorganic pigments or organic pigments. When considering that the color filter, in which the pigment dispersion composition of the invention is suitably used, preferably has a high transmittance and the like, an organic pigment is preferable, and use of a pigment having a particle size which is as small as possible is preferable. Further, when considering handling properties of the pigment dispersion composition and the colored curable composition that contains the pigment dispersion composition, the average primary particle diameter of the pigment is preferably 100 nm or less, more preferably 30 nm or less, and most preferably from 5 to 25 nm. A particle diameter within this range is effective for forming color filters having a high transmittance, good color properties, and a high contrast. The average primary particle diameter may be obtained by observing particles with an SEM or TEM, measuring particle sizes of 100 particles in an area in which no particle agglutination is observed, and calculating an average value thereof.

Examples of inorganic pigments include metal compounds such as metal oxides and metal complexes. Specific examples thereof include metal oxides of iron, cobalt, aluminum, cadmium, lead, copper, titanium, magnesium, chromium, zinc or antimony, and complex oxides of these metals.

Examples of organic pigments include C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, C. I. Pigment Orange 2, 5, 13, 16, 17:1, 31, 34, 36, 38, 43, 46, 48, 49, 51, 52, 55, 59, 60, 61, 62, 64, 71, 73, C. I. Pigment Green 7, 10, 36, 37, C. I. Pigment Blue 1, 2, 15, 15:1, 15:2, 15:3, 15:4, 15:6, 16, 22, 60, 64, 66, 79, a pigment obtained by replacing a CI substituent of C. I. Pigment Blue 79 with OH, 80, C. I Pigment Violet 1, 19, 23, 27, 32, 37, 42, C. I Pigment Brown 25, 28, and C. I Pigment Black 1, 7.

Among these, examples of preferable pigments include the following, but the pigments which can be used in the invention are not limited to these:

C. I. Pigment Yellow 11, 24, 108, 109, 110, 138, 139, 150, 151, 154, 167, 180, 185, C. I. Pigment Orange 36, 71, C. I. Pigment Red 122, 150, 171, 175, 177, 209, 224, 242, 254, 255, 264, C. I. Pigment Violet 19, 23, 32, C. I. Pigment Blue 15:1, 15:3, 15:6, 16, 22, 60, 66, C. I. Pigment Green 7, 36, 37, and C. I. Pigment Black 1, 7.

These organic pigments may be used singly, or in various combinations of two or more to improve color purity. Specific examples of combinations are as follows. For example, a red pigment selected from the group consisting of an anthraquinone pigment, a perylene pigment, and a diketopyrrolopyrrole pigment may be used singly, or at least one of these red pigments may be used in combination with a disazo yellow pigment, an isoindoline yellow pigment, a quinophthalone yellow pigment and/or a perylene red pigment, an anthraquinone red pigment, or a diketopyrrolopyrrole red pigment. For example, the anthraquinone pigment may be C. I. Pigment Red 177, the perylene pigment may be C. I. Pigment Red 155 or C. I. Pigment Red 224, and the diketopyrrolopyrrole pigment may be C. I. Pigment Red 254, and to obtain favorable color reproducibility, a mixture of at least one of these red pigments with C. I. Pigment Yellow 83, C. I. Pigment Yellow 139 or C. I. Pigment Red 177 is preferably used. The mass ratio of a red pigment to another pigment (red pigment:another pigment) is preferably from 100:5 to 100:80. When the mass ratio is 100:4 or less, it may be difficult to reduce transmittance of light from 400 nm to 500 nm, and color purity may not be improved. When the mass ratio is 100:81 or larger, coloring ability may be reduced. The mass ratio is particularly preferably within the range from 100:10 to 100:65. When a red pigment is combined with another red pigment, the mass ratio thereof may be adjusted in accordance with chromaticity.

As a green pigment, a halogenated phthalocyanine pigment may be used singly, or a mixture of a halogenated phthalocyanine pigment with a disazo yellow pigment, a quinophthalone yellow pigment, an azomethine yellow pigment or an isoindoline yellow pigment may be used. Preferable examples of such a mixture include a mixture of C. I. Pigment Green 7, 36 or 37 with C. I. Pigment Yellow 83, C. I. Pigment Yellow 138, C. I. Pigment Yellow 139, C. I. Pigment Yellow 150, C. I. Pigment Yellow 180 or C. I. Pigment Yellow 185. The mass ratio of the green pigment to the yellow pigment (green pigment:yellow pigment) is preferably from 100:5 to 100:200. When the mass ratio is less than 100:5, it may be difficult to reduce transmittance of light of from 400 nm to 450 nm, and color purity may not be improved. When the mass ratio is larger than 100:200, the dominant wavelength may shift to a longer wavelength, and there may be a large deviation from the NTSC (National Television System Committee) target hue. The mass ratio is particularly preferably within the range from 100:20 to 100:150.

As a blue pigment, a phthalocyanine pigment may be used singly, or a mixture of a phthalocyanine pigment with a dioxazine violet pigment may be used. A particularly suitable example of the mixture includes a mixture of C. I. Pigment Blue 15:6 with C. I. Pigment Violet 23.

The mass ratio of the blue pigment to the violet pigment (blue pigment:violet pigment) is preferably from 100:0 to 100:100, and more preferably 100:70 or less.

As a pigment suitably used for a black matrix, carbon black, graphite, titanium black, iron oxide and titanium oxide may be used singly, or in combination thereof, and a combination of carbon black and titanium black is preferable. The mass ratio of the carbon black to the titanium black (carbon black:titanium black) is preferably within a range from 100:0 to 100:60. When the mass ratio is 100:61 or more, dispersion stability may be reduced.

Processed Pigment

The pigment described above may be included in the colored curable composition of the invention after having been processed by a known salt milling treatment or the like (in other words, the pigment may be a processed pigment).

Such a processed pigment (hereinafter, also called "finely processed pigment") may be produced through processes of mechanically kneading i) a pigment, ii) a water-soluble inorganic salt, iii) a small amount of a water-soluble organic solvent that does not substantially dissolve ii) the water-soluble inorganic salt, and iv) a high molecular-weight compound having a heterocycle in a side chain thereof, using a kneader or the like (this process is called "salt milling"); putting the resultant mixture into water and mixing the same using a high-speed mixer or the like to produce a product as a slurry; and filtering the slurry, followed by washing with water, and as required, drying. The above production method provides a processed pigment that is fine and that exhibits little aggregation of pigments upon drying.

The following describes the salt milling in further detail. First, to a mixture of i) an organic pigment and ii) a water-soluble inorganic salt, a small amount of iii) a water-soluble organic solvent as a wetting agent is added, and the resultant mixture is strongly kneaded using a kneader or the like. After that, the mixture is put into water and stirred with a high-speed mixer or the like to produce a slurry. Next, the slurry is filtered, washed with water, and, as required, dried, thereby producing fine pigments. When the pigment is to be used as a dispersion in an oil varnish, the processed pigment before drying (which is called a filtered cake) may be dispersed in an oil varnish, while removing water by a method generally called flushing. When the pigment is to be dispersed in a water-based varnish, the processed pigment does not need to be dried, and the filtered cake can be directly dispersed in the varnish.

In the invention, by using iv) a resin which is at least partially soluble together with iii) the organic solvent at the time of the salt milling, it is possible to obtain an even finer processed pigment which has a surface coated with iv) the resin which is at least partially soluble, and which exhibits little aggregation of pigments upon drying.

It is also possible to prevent aggregation upon drying of the pigments by a method including adding an alkali-soluble resin dissolved in an aqueous alkali solution into the slurry, then sufficiently stirring and mixing the mixture, and then neutralizing using an aqueous acidic solution such as hydrochloric acid or sulfuric acid to deposit the resin onto the pigment, or adding an aqueous solution of a water soluble polyvalent metal salt such as calcium chloride or barium chloride to precipitate and deposit the resin onto the pigment.

Further, iv) the high molecular-weight compound having a heterocycle in a side chain thereof may be added at the initial stage of the salt milling process at once, or may be added in separate portions.

ii) Water-Soluble Inorganic Salt

The ii) water-soluble inorganic salt is not particularly limited as long as it dissolves in water, and sodium chloride, barium chloride, potassium chloride, sodium sulfate, or the like may be used. From a standpoint of cost, use of sodium chloride or sodium sulfate is preferable.

The amount of the inorganic salt used in the salt milling is, from standpoints of both treatment efficiency and production efficiency, from 1 to 30 times by mass the organic pigment, and, particularly preferably from 5 to 25 times by mass, because, although a higher amount ratio of the inorganic salt relative to the organic pigment gives a higher efficiency in particle size reduction, the amount of the pigment per one treatment becomes small.

iii) Small Amount of Water-Soluble Organic Solvent that Substantially does not Dissolve ii)

The water-soluble organic solvent acts to wet the organic pigment and the inorganic salt. The water-soluble organic solvent is not particularly limited as long as it dissolves in (mixes with) water and substantially does not dissolve an inorganic salt to be used. However, since the temperature rises at the salt milling to lead to circumstances in which the solvent is likely to evaporate, a high boiling point solvent having a boiling point of 120° C. or more is preferable from the standpoint of safety. Examples of the water-soluble organic solvent include 2-methoxy ethanol, 2-butoxy ethanol, 2-(isopentyloxy)ethanol, 2-(hexyloxy)ethanol, ethyleneglycol, diethylene glycol, diethylene glycol monoethyl ether, diethylene glycol monoethyl ether acetate, diethylene glycol monobutyl ether, triethylene glycol, triethylene glycol monomethyl ether, liquid polyethylene glycol, 1-methoxy-2-propanol, 1-ethoxy-2-propanol, dipropylene glycol, dipropylene glycol monomethyl ether, dipropylene glycol monoethyl ether, and liquid polypropylene glycol.

The amount of the water-soluble organic solvent to be added is preferably from 5% by mass to 50% by mass with respect to the inorganic salt, more preferably from 10% by mass to 40% by mass with respect to the inorganic salt, and most suitably from 15% by mass to 35% by mass with respect to the inorganic salt. The amount of 5% by mass or more enables more uniform kneading to be performed and narrower distribution of particle sizes. The amount of 50% by mass or less enables more effective suppression of excessive softening of a kneading composition, easier application of shear to the kneading composition, and more effective reduction in particle size.

The iii) water-soluble organic solvent may be added at the initiation of the salt milling at once, or may be added in separate portions. The water-soluble organic solvent may be used singly, or two or more kinds thereof may be used in combination.

iv) High Molecular-Weight Compound Having Heterocycle in Side Chain Thereof

The iv) high molecular-weight compound having a heterocycle in a side chain thereof is not particularly limited.

As such a high molecular-weight compound, a polymer containing a polymerization unit derived from a monomer represented by the following Formula (1) or derived from a monomer composed of maleimide or a maleimide derivative is preferable, and a polymer containing a polymerization unit derived from a monomer represented by the following Formula (1) is particularly preferable.

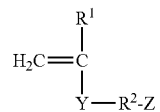

Formula (1)

In Formula (1), $R^1$ represents a hydrogen atom or a substituted or unsubstituted alkyl group; $R^2$ represents a single bond or a divalent linking group; Y represents —CO—, —C(=O)O—, —CONH—, —OC(=O)—, or a phenylene group; and Z represents a group having a nitrogen-containing heterocycle structure.

The alkyl group represented by $R^1$ is an alkyl group having preferably 1 to 12 carbon atoms, more preferably 1 to 8 carbon atoms, and particularly preferably 1 to 4 carbon atoms.

When the alkyl group represented by $R^1$ has a substituent, examples of the substituent include a hydroxyl group, an alkoxy group (an alkoxy group having preferably 1 to 5 carbon atoms, more preferably 1 to 3 carbon atoms), a methoxy group, an ethoxy group, and a cyclohexyloxy group.

Specific examples of preferable alkyl groups represented by $R^1$ include a methyl group, an ethyl group, a propyl group, a n-butyl group, an i-butyl group, a t-butyl group, a n-hexyl group, a cyclohexyl group, a 2-hydroxyethyl group, a 3-hydroxypropyl group, a 2-hydroxypropyl group, and a 2-methoxyethyl group. $R^1$ is most preferably a hydrogen atom or a methyl group.

In Formula (1), $R^2$ represents a single bond or a divalent linking group. As the divalent linking group, a substituted or unsubstituted alkylene group is preferable. The alkylene group has preferably 1 to 12 carbon atoms, more preferably 1 to 10 carbon atoms, furthermore preferably 1 to 8 carbon atoms, and particularly preferably 1 to 4 carbon atoms.

The alkylene group represented by $R^2$ may be one formed by connecting two or more alkylene groups via a hetero atom (for example, an oxygen atom, a nitrogen atom, or a sulfur atom).

Specific examples of preferable alkylene groups represented by $R^2$ include a methylene group, an ethylene group, a propylene group, a trimethylene group and a tetramethylene group.

When the alkylene group represented by $R^2$ has a substituent, examples of the substituent include a hydroxyl group.

The divalent linking group represented by $R^2$ may be one that has a hetero atom or a partial structure including a hetero atom, which is selected from —O—, —S—, —C(=O)O—, —CONH—, —C(=O)S—, —NHCONH—, —NHC(=O)O—, —NHC(=O)S—, —OC(=O)—, —OCONH— and —NHCO—, at an end of the alkylene group, and that is connected with Z via the hetero atom or the partial structure including a hetero atom.

In Formula (1), Z represents a group having a heterocyclic structure. Examples of the group having a heterocyclic structure include dye structures of phthalocyanine, insoluble azo, azo lake, anthraquinone, quinacridone, dioxazine, diketopyrrolopyrrole, anthrapyridine, anthanthrone, indanthrone, flavanthrone, perinon, perylene, thioindigo, and the like, and heterocyclic structures such as thiophene, furan, xanthene, pyrrole, pyrroline, pyrrolidine, dioxolan, pyrazole, pyrazoline, pyrazolidine, imidazole, oxazole, thiazole, oxadiazole, triazole, thiadiazole, pyran, pyridine, piperidine, dioxane, morpholine, pyridazine, pyrimidine, piperazine, triazine, trithiane, isoindoline, isoindolinone, benzimidazolon, benzothiazole, succinimide, phthalimide, naphthalimide, hydantoin, indole, quinoline, carbazole, acridine, acridone, anthraquinone, pyrazine, tetrazole, phenothiazine, phenoxazine, benzimidazole, benztriazole, cyclic amide, cyclic urea, or cyclic imide. These heterocyclic structures may each have a substituent, and examples of the substituent include an alkyl group, an alkoxy group, a halogen atom, an aliphatic ester group, an aromatic ester group, and an alkoxycarbonyl group.

Z is more preferably a group having a nitrogen-containing heterocyclic structure having 6 or more carbon atoms, and is particularly preferably a group having a nitrogen-containing heterocyclic structure having 6 to 12 carbon atoms. Specifically, the nitrogen-containing heterocyclic structure having 6 or more carbon atoms is preferably a phenothiazine ring, a phenoxazine ring, an acridone ring, an anthraquinone ring, a benzimidazole structure, a benztriazole structure, a benzothiazole structure, a cyclic amide structure, a cyclic urea structure, or a cyclic imide structure are preferable, and is particularly preferably a structure represented by the following Formula (2), (3) or (4).

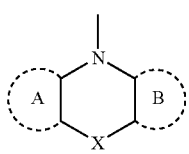

Formula (2)

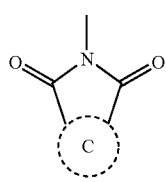

Formula (3)

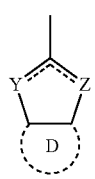

Formula (4)

In Formula (2), X is any selected from the group consisting of a single bond, an alkylene group (such as a methylene group, an ethylene group, a propylene group, a trimethylene group, or a tetramethylene group), —O—, —S—, —NR$^A$—, and —C(=O)—. Here, R$^A$ represents a hydrogen atom or an alkyl group. The alkyl group when R$^A$ represents an alkyl group is preferably an alkyl group having 1 to 18 carbon atoms, more preferably an alkyl group having 1 to 6 carbon atoms, and specific examples of the alkyl group include a methyl group, an ethyl group, a n-propyl group, an i-propyl group, a n-butyl group, a t-butyl group, a n-hexyl group, a n-octyl group, a 2-ethylhexyl group, and a n-octadecyl group.

Among these, X in Formula (2) is preferably a single bond, a methylene group, —O—, or —C(=O)—, and particularly preferably —C(=O)—.

In Formula (4), Y and Z each independently represents —N=, —NH—, —N(R$^B$)—, —S—, or —O—. R$^B$ represents an alkyl group, and the alkyl group when R$^B$ represents an alkyl group is preferably an alkyl group having 1 to 18 carbon atoms, and more preferably an alkyl group having 1 to 6 carbon atoms, and specific examples of the alkyl group include a methyl group, an ethyl group, a n-propyl group, an i-propyl group, a n-butyl group, a t-butyl group, a n-hexyl group, a n-octyl group, a 2-ethylhexyl group, and a n-octadecyl group.

Among these, it is preferable that Y and Z in Formula (4) are each independently —N=, —NH—, or —N(R$^B$)—. As a combination of Y and Z, a combination, in which either one of Y and Z is —N= and the other is —NH—, that is, an imidazolyl group is mentioned.

In Formulae (2), (3) and (4), rings A, B, C and D each independently represents an aromatic ring. Examples of the aromatic ring include a benzene ring, a naphthalene ring, an indene ring, an azulene ring, a fluorene ring, an anthracene ring, a pyridine ring, a pyrazine ring, a pyrimidine ring, a pyrrole ring, an imidazole ring, an indole ring, a quinoline ring, an acridine ring, a phenothiazine ring, a phenoxazine ring, an acridone ring, and an anthraquinone ring. Among these, a benzene ring, a naphthalene ring, an anthracene ring, a pyridine ring, a phenoxazine ring, an acridine ring, a phenothiazine ring, an acridone ring and an anthraquinone ring are preferable, and a benzene ring, a naphthalene ring and pyridine ring are particularly preferable.

Specific examples of rings A and B in Formula (2) include a benzene ring, a naphthalene ring, a pyridine ring, and a pyrazine ring. Examples of ring C in Formula (3) include a benzene ring, a naphthalene ring, a pyridine ring, and a pyrazine ring. Examples of ring D in Formula (4) include a benzene ring, a naphthalene ring, a pyridine ring, and a pyrazine ring.

Among structures represented by Formulae (2), (3) and (4), from the standpoints of the dispersibility and long-term stability of a dispersion liquid, a benzene ring and a naphthalene ring are more preferable; in Formulae (2) or (4), a benzene ring is furthermore preferable, and, in Formula (3), a naphthalene ring is furthermore preferable.

Preferable specific examples of monomers represented by Formula (1), maleimide, and maleimide derivatives in iv) the high molecular-weight compound having a heterocycle in a side chain thereof are shown below, but the invention is not limited to these.

M-1
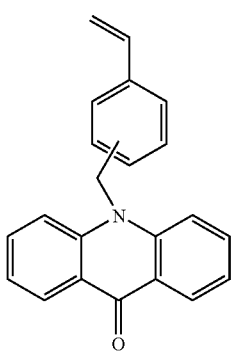
M-2
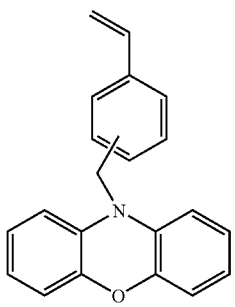
M-3
M-4
M-5
M-6
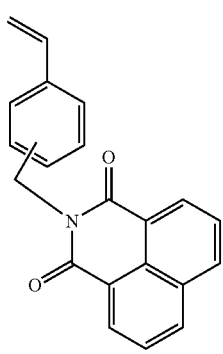
M-7
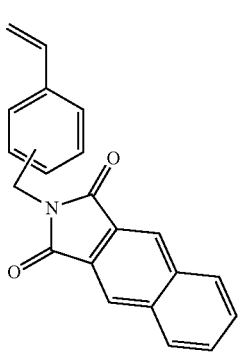
M-8
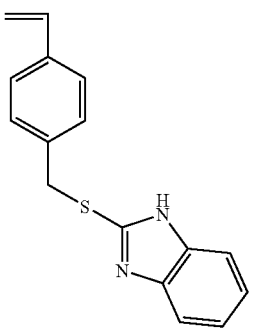
M-9
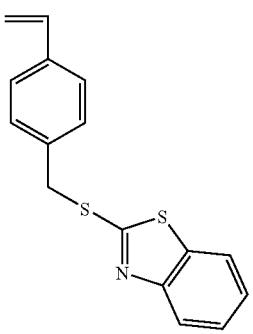

M-10
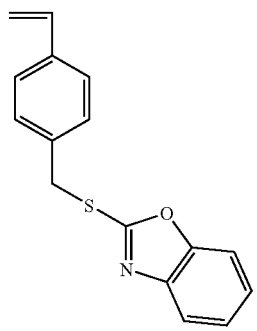
M-11
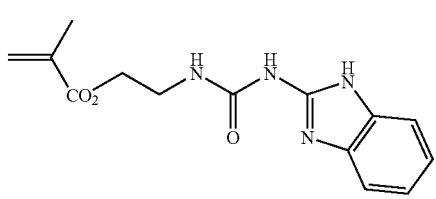
M-12
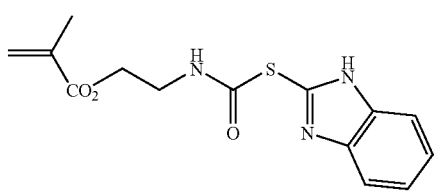
M-13
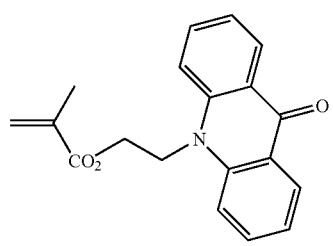
M-14
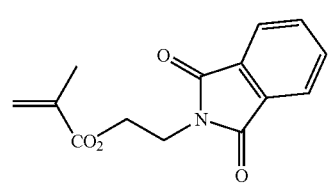
M-15
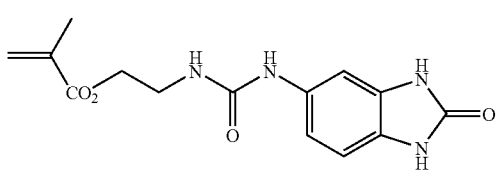
M-16
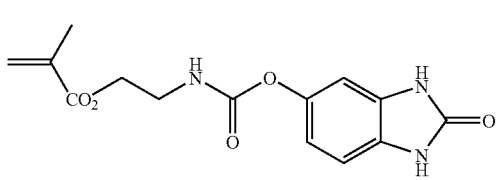
M-17
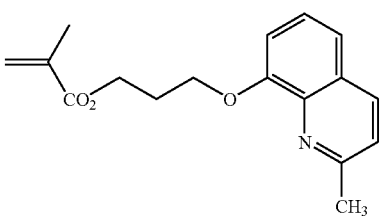
M-18
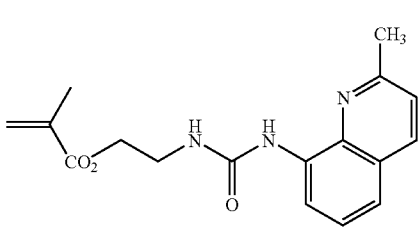
M-19
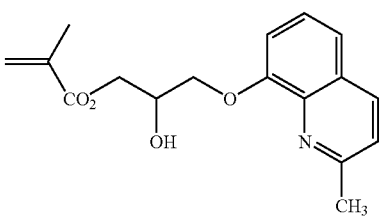
M-20
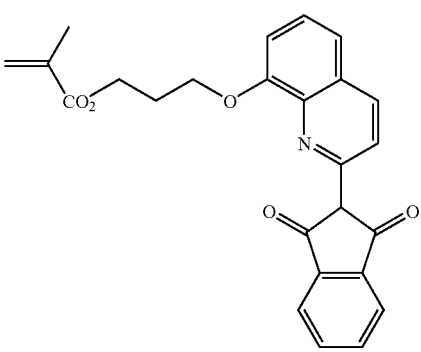
M-21
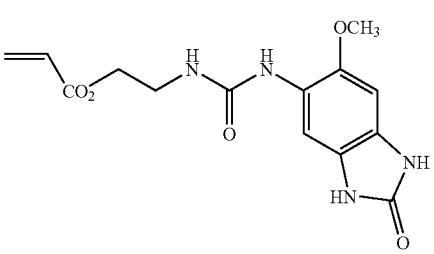
M-22
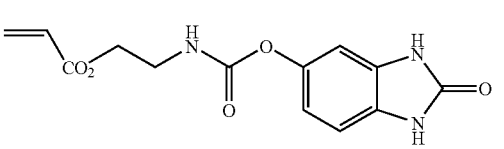

-continued

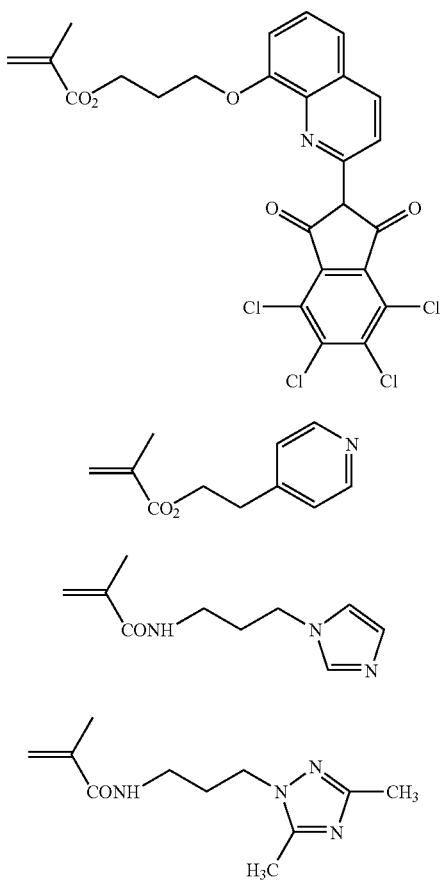

M-23

M-24

M-25

M-26

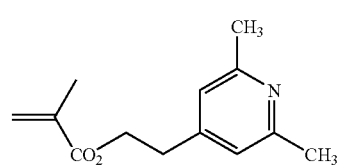

M-27

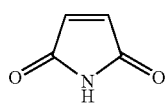

M-28

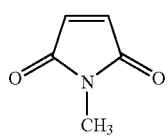

M-29

M-30

-continued

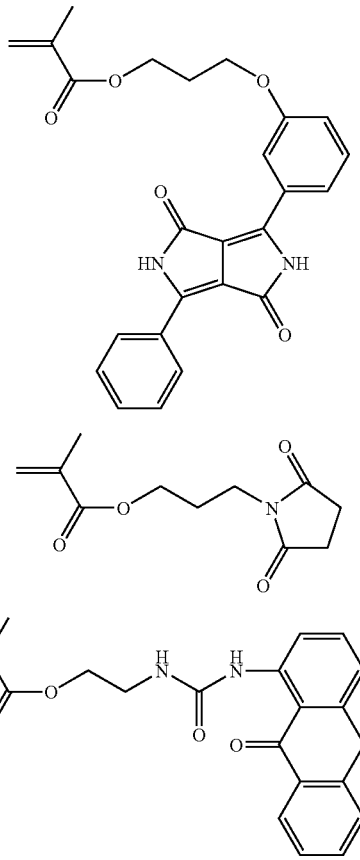

M-31

M-32

M-33

The iv) high molecular-weight compound having a heterocycle in a side chain thereof may contain only one copolymerization unit derived from the monomer represented by Formula (1), maleimide or maleimide derivatives, or two or more of the copolymerization units.

In the iv) high molecular-weight compound having a heterocycle in a side chain thereof, the amount of the copolymerization unit derived from the monomer represented by Formula (1), maleimide or maleimide derivatives is not particularly limited. However, when denoting the total structural unit included in the high molecular-weight compound having a heterocycle in a side chain thereof by 100% by mass, it is preferable that the high molecular-weight compound having a heterocycle in a side chain thereof includes the copolymerization unit derived from the monomer represented by Formula (1), maleimide or maleimide derivatives in an amount of 5% by mass or more, and more preferably from 10 to 50% by mass. Among the monomer represented by Formula (1), maleimide and maleimide derivatives, the monomer represented by Formula (1) is preferable because it is highly adsorbed to pigment.

That is, in order to effectively suppress the generation of secondary aggregates, which are the aggregates of primary particles of pigment, or to effectively weaken aggregation force of the secondary aggregates, the amount of the copolymerization unit derived from the monomer represented by Formula (1), maleimide or maleimide derivatives is preferably 5% by mass or more. Further, from the standpoint of development properties upon producing color filters using the curable colored composition containing the pigment dispersion composition, the amount of the copolymerization unit derived from the monomer represented by Formula (1) is preferably 50% by mass or less.

The iv) high molecular-weight compound having a heterocycle in a side chain thereof preferably includes an additional copolymerization unit derived from a monomer having an acid group. Since the additional copolymerization unit derived from a monomer having an acid group is incorporated in the high molecular-weight compound, excellent removability of unexposed areas upon development may be attained when the pigment dispersion composition is applied to a photosensitive composition.

Examples of the monomer having an acid group include unsaturated monocarboxylic acids such as acrylic acid, methacrylic acid, crotonic acid, α-chloracrylic acid or cinnamic acid; unsaturated dicarboxylic acids and anhydrides thereof such as maleic acid, maleic anhydride, fumaric acid, itaconic acid, itaconic anhydride, citraconic acid, citraconic anhydride or mesaconic acid; unsaturated trivalent or higher valent carboxylic acids and anhydrides thereof; mono[(meth)acryloyloxyalkyl]esters of divalent or higher valent carboxylic acids such as mono(2-acryloyloxyethyl)succinate, mono(2-methacryloyloxyethyl)succinate, mono(2-acryloyloxyethyl)phthalate or mono(2-methacryloyloxyethyl)phthalate; and mono(meth)acrylates of polymers having carboxyl groups at both ends such as ω-carboxy-polycaprolactone monoacrylate or ω-carboxy-polycaprolactone monomethacrylate. The high molecular-weight compound may include only one copolymerization unit derived from the monomer having an acid group, or may include two or more thereof.

In the iv) high molecular-weight compound having a heterocycle in a side chain thereof, the content of the copolymerization unit derived from the monomer having an acid group is preferably from 50 to 200 mgKOH/g, more preferably from 80 to 200 mgKOH/g, and particularly preferably from 100 to 180 mgKOH/g. That is, from the standpoint of suppressing generation of precipitates in a developer, the amount of the copolymerization unit derived from the monomer having an acid group is preferably 50 mgKOH/g or more. When the acid value is 200 mgKOH/g or less, aggregation among acid groups becomes weak; thus, the aggregation between processed pigments can be suppressed more efficiently, and the dispersibility can be further improved.

For the purpose of suppressing effectively the generation of secondary aggregates, which are aggregates of the primary particles of pigment, or of weakening effectively the aggregation force of secondary aggregates, the amount of the copolymerization unit derived from the monomer having an acid group is preferably within the above range.

The iv) high molecular-weight compound having a heterocycle in a side chain thereof in the invention may additionally include a copolymerization unit derived from a copolymerizable vinyl monomer, in an amount that does not impair the effects of the invention.

The vinyl monomers to be used is not particularly limited, but preferable examples thereof include (meth)acrylic acid esters, crotonic acid esters, vinyl esters, maleic acid diesters, fumaric acid diesters, itaconic acid diesters, (meth)acrylamides, vinyl ethers, esters of vinyl alcohol, styrenes, and (meth)acrylonitrile. Specific examples of such vinyl monomers include compounds as described below. Meanwhile, when representing either of "either acrylic or methacrylic" or both in the specification, occasionally a denotation of "(meth) acrylic" is used.

Examples of (meth)acryric acid esters include methyl (meth)acrylate, ethyl(meth)acrylate, n-propyl(meth)acrylate, isopropyl(meth)acrylate, n-butyl(meth)acrylate, isobutyl (meth)acrylate, t-butyl(meth)acrylate, n-hexyl(meth)acrylate, cyclohexyl(meth)acrylate, t-butylcyclohexyl(meth)acrylate, 2-ethylhexyl(meth)acrylate, t-octyl(meth)acrylate, dodecyl(meth)acrylate, octadecyl(meth)acrylate, acetoxyethyl(meth)acrylate, phenyl(meth)acrylate, 2-hydroxyethyl (meth)acrylate, 2-methoxyethyl(meth)acrylate, 2-ethoxyethyl(meth)acrylate, 2-(2-methoxyethoxy)ethyl(meth)acrylate, 3-phenoxy-2-hydroxypropyl(meth)acrylate, benzyl (meth)acrylate, diethylene glycol monomethyl ether(meth)acrylate, diethylene glycol monoethyl ether(meth)acrylate, triethylene glycol monomethyl ether(meth)acrylate, triethylene glycol monoethyl ether(meth)acrylate, polyethylene glycol monomethyl ether(meth)acrylate, polyethylene glycol monoethyl ether(meth)acrylate, β-phenoxy ethoxy ethyl (meth)acrylate, nonylphenoxy polyethylene glycol(meth)acrylate, dicyclopentenyl(meth)acrylate, dicyclopentenyloxyethyl(meth)acrylate, trifluoroethyl(meth)acrylate, octafluoropentyl(meth)acrylate, perfluorooctylethyl(meth)acrylate, dicyclopentanyl(meth)acrylate, tribromophenyl (meth)acrylate, and tribromophenyl oxyethyl(meth)acrylate.

Examples of crotonic acid esters include butyl crotonate and hexyl crotonate.

Examples of vinyl esters include vinyl acetate, vinyl propionate, vinyl butyrate, vinyl methoxy acetate, and vinyl benzoate.

Examples of maleic acid diesters include dimethyl maleate, diethyl maleate, and dibutyl maleate.

Examples of fumaric acid diesters include dimethyl fumarate, and diethyl fumarate, dibutyl fumarate.

Examples of itaconic acid diesters include dimethyl itaconate, diethyl itaconate, and dibutyl itaconate.

Examples of (meth)acrylamides include (meth)acrylamide, N-methyl(meth)acrylamide, N-ethyl(meth)acrylamide, N-propyl(meth)acrylamide, N-isopropyl(meth)acrylamide, N-n-butyl(meth)acrylamide, N-t-butyl(meth) acrylamide, N-cyclohexyl(meth)acrylamide, N-(2-methoxyethyl)(meth)acrylamide, N,N-dimethyl(meth)acrylamide, N,N-diethyl(meth)acrylamide, N-phenyl(meth)acrylamide, N-benzyl(meth)acrylamide, (meth)acryloyl morpholine, and diacetone acrylamide.

Examples of vinyl ethers include methyl vinyl ether, butyl vinyl ether, hexyl vinyl ether, and methoxy ethyl vinyl ether.

Examples of styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethyl styrene, hydroxystyrene protected by a group deprotectable with an acidic substance (such as t-Boc), methyl vinyl benzoate, and α-methyl styrene.

The iv) high molecular-weight compound having a heterocycle in a side chain thereof in the invention preferably has a weight average molecular weight (Mw) within a range from 1,000 to 100,000, and a number average molecular weight (Mn) within a range from 400 to 50,000; more preferably a weight average molecular weight (Mw) within a range from 5,000 to 50,000, and a number average molecular weight (Mn) within a range from 2,000 to 30,000; and particularly preferably a weight average molecular weight (Mw) within a range from 8,000 to 30,000, and a number average molecular weight (Mn) within a range from 4,000 to 12,000.

That is, from the standpoint of suppressing effectively the generation of the secondary aggregates which are aggregates of the primary particles of pigment, or weakening effectively the aggregation force of the secondary aggregates, the weight average molecular weight (Mw) of the high molecular-weight compound having a heterocycle in a side chain thereof is preferably 1,000 or more. Further, from the standpoint of developing properties upon producing color filters using the curable colored composition containing the pigment dispersion composition, the weight average molecular weight (Mw) of the high molecular-weight compound having a heterocycle in a side chain thereof is preferably 100,000 or less.

In a pigment dispersion composition described later, the amount (mass ratio) of the iv) high molecular-weight compound having a heterocycle in a side chain thereof with respect to i) pigment (i.e., i) pigment: iv) high molecular-weight compound having a heterocycle in a side chain thereof) is preferably from 1:0.01 to 1:2, more preferably from 1:0.05 to 1:1, and further preferably from 1:0.1 to 1:0.6.

The iv) high molecular-weight compound having a heterocycle in a side chain thereof may be produced, for example, using a monomer represented by Formula (1), a polymerizable oligomer (macromonomer), and another radical-polymerizable compound as a copolymerization component by an ordinary radical polymerization method. Generally, a suspension polymerization method, a solution polymerization method, or the like is employed. Examples of a solvent for use in synthesizing such a polymer include ethylene dichloride, cyclohexanone, methyl ethyl ketone, acetone, methanol, ethanol, propanol, butanol, ethylene glycol monomethyl ether, ethylene glycol monoethyl ether, 2-methoxy ethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, and ethyl lactate. These solvents may be used singly, or in a mixture of two or more thereof.

Upon the radical polymerization, a radical polymerization initiator may be used, and, in addition, a chain transfer agent (for example, 2-mercaptoethanol or dodecylmercaptan) may be used.

The processed pigment is characterized in that the i) pigment particle (such as an organic pigment) is coated with the iv) high molecular-weight compound having a heterocycle in a side chain thereof, in which the high molecular-weight compound is coated strongly to a part or the whole of the surface of the pigment particle thereby exerting the effect of the invention. This configuration is different from one in which particles are formed by the adsorption of a general high molecular-weight dispersant at a pigment. The coating state can be confirmed by measuring the isolation amount (isolation ratio) of the high molecular-weight compound by washing with an organic solvent, which is indicated below. That is, most, specifically 65% or more, of the high molecular-weight compounds that are simply adsorbed are isolated and removed by the washing with an organic solvent. In contrast, in the case of the processed pigment having the coated surface as described above, the isolation ratio is extremely small, that is, 30% or less.

By washing the processed pigment with 1-methoxy-2-propanol, the isolation amount may be calculated, for example, as follows. In the method, 10 g of the processed pigment is put into 100 ml of 1-methoxy-2-propanol, followed by shaking using a shaker at room temperature for 3 hours. After that, the pigment is precipitated with a centrifuge at 80,000 rpm over 8 hours, and the solid content in the supernatant is obtained by a drying method. The mass of the high molecular-weight compound isolated from the pigment is obtained, and the isolation ratio (%) thereof relative to the mass of the high molecular-weight compound used in the initial treatment, is calculated.

The isolation ratio of commercially available processed pigments can be measured by the following method. After the whole processed pigment is dissolved in a solvent that dissolves the pigment (such as dimethylsulfoxide, dimethyl formamide, formic acid, or sulfuric acid), the high molecular-weight compound is separated from the pigment using an organic solvent by utilizing the difference in the solubilities thereof, to calculate the mass of the high molecular-weight compound used in the initial treatment. Separately, the processed pigment is washed with 1-methoxy-2-propanol to obtain an isolated amount, which is divided by the calculated mass of the high molecular-weight compound used in the initial treatment to obtain the isolation ratio (%).

A smaller isolation ratio indicates a higher coating ratio of the pigment, and good dispersibility and dispersion stability. The range of the isolation ratio is preferably 30% or less, more preferably 20% or less, and most preferably 15% or less, and ideally 0%.

In addition to the specific high molecular-weight compound, according to need, another compound may be used at the same time. Such an additional compound is preferably a solid at room temperature, water-insoluble, and needs to be at least partially soluble in a water-soluble organic solvent used as a wetting agent at the salt milling. For example, a natural resin, a modified natural resin, a synthetic resin, a synthetic resin modified with a natural resin, or the like is used.

When a dried processed pigment is used, an additional compound to be used is preferably solid at room temperature. Examples of the natural resin include rosin. Examples of the modified natural resin include rosin derivatives, cellulose derivatives, rubber derivatives, protein derivatives, and oligomers thereof. As the synthetic resin, epoxy resin, acrylic resin, maleic resin, butyral resin, polyester resin, melamine resin, phenol resin, polyurethane resin, and the like are mentioned. As the synthetic resin modified with natural resin, rosin-modified maleic resin, rosin-modified phenol resin, and the like are mentioned.

Examples of the synthetic resin include polyamidoamine and salts thereof, polycarboxylic acid and salts thereof, high molecular-weight unsaturated acid ester, polyurethane, polyester, poly(meth)acrylate, (meth)acrylic copolymers, and naphthalene sulfonic acid formalin condensates.

In the processed pigment obtained in this way, the pigment surface is strongly coated with the high molecular-weight compound, which is not isolated even when being immersed in an organic solvent. Therefore, the processed pigment is excellent in dispersibility and dispersion stability, which shows a wide application range and, particularly, is useful for preparing a pigment dispersion composition.

Pigment Dispersion Composition

The pigment in the invention may be included in the colored curable composition of the invention in a state of a pigment dispersion composition (hereinafter, also called "a pigment dispersion") in which the pigment is dispersed in a solvent with a known pigment dispersant or pigment derivative.

The pigment dispersion composition includes the pigment in the invention (for example, the processed pigment) dispersed in an organic solvent.

The use of a pigment derivative and/or dispersant appropriately according to need, upon dispersing the pigment, is also a preferable embodiment.

Organic Solvent

The solvent in the pigment dispersion composition is not particularly limited as long as it is an organic solvent. The solvent may be selected from known organic solvents. Examples thereof include (poly)alkylene glycol monoalkyl ethers and acetic acid esters thereof such as 1-methoxy-2-propyl acetate, 1-methoxy-2-propanol, ethylene glycol monomethyl ether, ethylene glycol monoethyl ether, propylene glycol monomethyl ether, propylene glycol monoethyl ether, diethylene glycol monomethyl ether, or ethylene glycol monoethyl ether; acetic acid esters such as ethyl acetate, n-propyl acetate, i-propyl acetate, n-butyl acetate, or i-butyl acetate; aromatic hydrocarbons such as benzene, toluene, or xylene; ketones such as methyl ethyl ketone, acetone, methyl isobutyl ketone, or cyclohexanone; and alcohols such as ethanol, propanol, butanol, hexanol, cyclohexanol, ethylene glycol, diethylene glycol, or glycerine. These may be used singly, or in combination of two or more thereof. Among these, alkylene glycol monoalkyl ethers and acetic acid esters thereof, acetic acid esters, methyl ethyl ketone, and the like are preferable.

The amount of the solvent in the pigment dispersion composition is appropriately selected in accordance with applications of the pigment dispersion composition, and the like. When the pigment dispersion composition is used for preparing a photocurable composition described later, the solvent may be included so as to give a solid content including the pigment and the pigment dispersant of from 5 to 50% by mass, from the standpoint of handling properties.

(A) Pigment Derivatives

To the pigment dispersion composition, a pigment derivative is added according to need. By making a pigment derivative to which a moiety having affinity with a dispersant or a polar group is introduced be adsorbed to the pigment surface, and using the same as an adsorption point of the dispersant, it is possible to disperse the pigment in the photocurable composition as fine particles and to prevent reaggregation thereof, and is effective to constitute color filters having high contrast and excellent transparency.

The pigment derivative is, specifically, a compound having an organic pigment as a mother skeleton, and a substituent such as an acidic group, a basic group, or an aromatic group introduced to a side chain thereof. Specific examples of organic pigments include quinacridone pigment, phthalocyanine pigment, azo pigment, quinophthalone pigment, isoindoline pigment, isoindolinone pigment, quinoline pigment, diketopyrrolopyrrole pigment, and benzimidazolone pigment. Pale yellow aromatic polycyclic compounds such as naphthalene compounds, anthraquinone compounds, triazine compounds or quinoline compounds, which are generally not called a dye, are also included. Further, examples of the pigment derivatives include also those described in JP-A Nos. 11-49974, 11-189732, 10-245501, 2006-265528, 8-295810, 11-199796, 2005-234478, 2003-240938, 2001-356210, or the like.

The amount of the pigment derivative in the pigment dispersion composition is preferably from 1 to 30% by mass, and more preferably from 3 to 20% by mass, with respect to the mass of the pigment. The amount within the above range enables excellent dispersion to be performed, and improvement in dispersion stability after the dispersion, while suppressing the viscosity at a low level, to give high transmittance and excellent color properties. When the composition is used for producing a color filter, it is possible to constitute it with good color properties and high contrast.

The dispersion may be performed, for example, by previously mixing a pigment and a dispersant and previously dispersing the mixture with a homogenizer and the like, and, next, by finely dispersing the product with a bead dispersing machine using zirconia beads and the like (for example, DISPERMAT manufactured by GETZMANN). The dispersion time is favorably around from 3 to 6 hours.

(B) Dispersant

For the purpose of further improving the dispersibility of the pigment, it is also possible to add a dispersant such as a conventionally known pigment dispersant, surfactant, or another component.

Examples of known dispersants (pigment dispersant) include polymer dispersants (such as polyamideamine and salts thereof, polycarboxylic acids and salts thereof, high molecular-weight unsaturated acid esters, modified polyurethane, modified polyester, modified poly(meth)acrylate, (meth)acrylic copolymers, or naphthalene sulfonic acid formalin condensates), polyoxyethylene alkyl phosphoric ester, polyoxyethylene alkyl amine, alkanol amine, and pigment derivatives.

The polymer dispersant may be further classified into a linear polymer, a terminal-modified polymer, a graft polymer, and a block polymer, in accordance with the structure thereof.

The polymer dispersant is adsorbed onto the surface of the pigment, and acts so as to prevent reaggregation. Accordingly, the terminal-modified polymer, graft polymer and block polymer having an anchor site for the pigment surface can be mentioned as preferable structures. Meanwhile, the pigment derivative has an effect of accelerating the adsorption of the polymer dispersant since the pigment derivative modifies the pigment surface.

The polymer dispersant is adsorbed onto the pigment surface and acts so as to prevent reaggregation in the dispersing process, as is the case for the high molecular-weight compound having a heterocycle in a side chain thereof and having a weight average molecular weight of 1,000 or more. Therefore, a block polymer, graft polymer and terminal-modified polymer having an anchor site for the pigment surface are mentioned as preferable structures. Meanwhile, the pigment derivative has an effect of accelerating the adsorption of the polymer dispersant since it modifies the pigment surface.

Block Polymer

Although the block polymer is not particularly limited, a block polymer having a block which is adsorbed to the pigment and a block which is not adsorbed to the pigment is mentioned.

Although a monomer constituting the block which is adsorbed to the pigment is not particularly limited, for example, a monomer having a functional group capable of being adsorbed to the pigment is used. Specifically, a monomer having an organic dye structure or a heterocyclic structure, a monomer having an acidic group, a monomer having a basic nitrogen atom, and the like are mentioned.

Examples of the monomer having an organic dye structure or a heterocyclic structure include monomers having a dye structure of phthalocyanine, insoluble azo, azo lake, anthraquinone, quinacridone, dioxazine, diketopyrrolopyrrole, anthrapyridine, anthanthrone, indanthrone, flavanthrone, perinon, perylene, or thioindigo; and monomers having a heterocyclic structure such as thiophene, furan, xanthene, pyrrole, pyrroline, pyrrolidine, dioxolan, pyrazole, pyrazoline, pyrazolidine, imidazole, oxazole, thiazole, oxadiazole, triazole, thiadiazole, pyran, pyridine, piperidine, dioxane, morpholine, pyridazine, pyrimidine, piperazine, triazine, trithiane, isoindoline, isoindolinone, benzimidazolon, benzothiazole, succinimide, phthalimide, naphthalimide, hydantoin, indole, quinoline, carbazole, acridine, acridone, or anthraquinone. More specific examples thereof include, but not particularly limited to, monomers having the following structures.

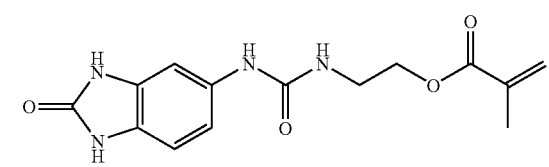
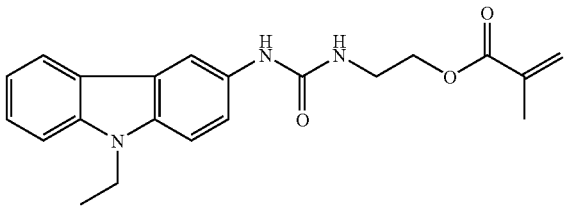
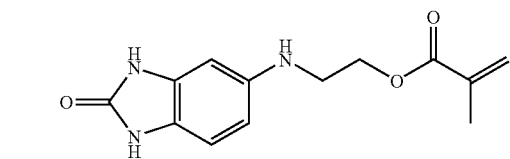
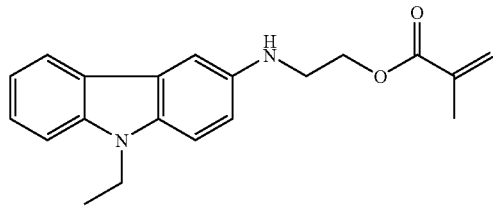
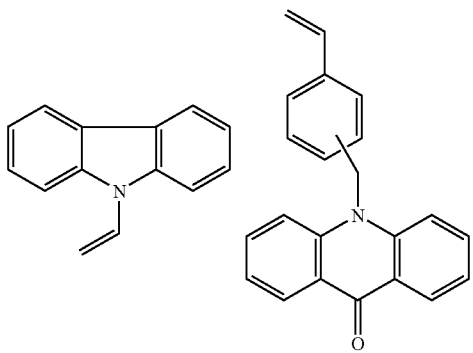
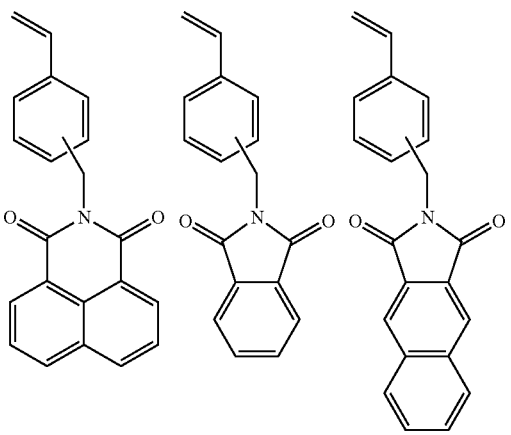
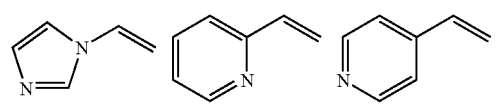
-continued
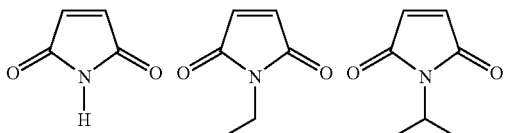
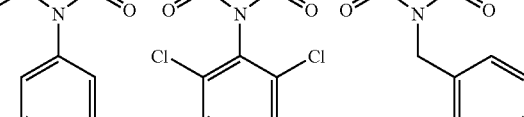
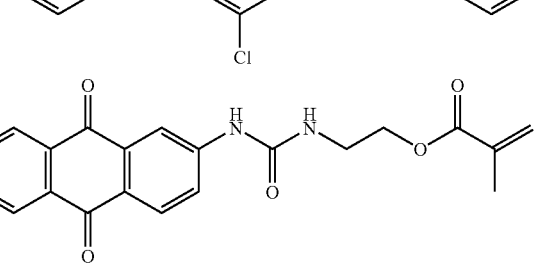
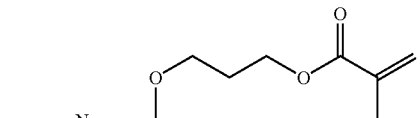
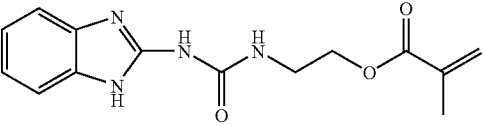
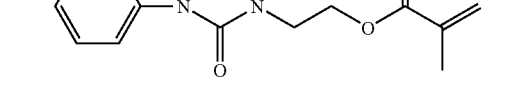
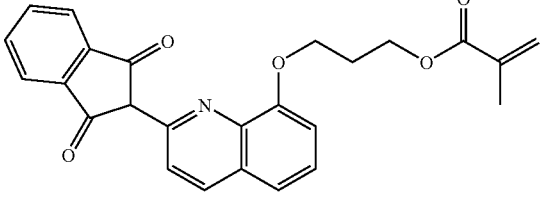
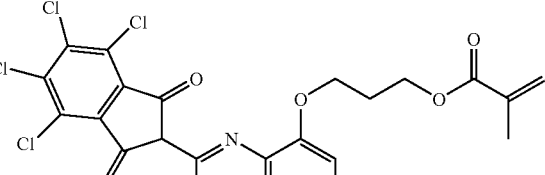

Examples of the monomer having an acidic group include vinyl monomers having a carboxyl group, and vinyl monomers having a sulfonic acid group.

Examples of the vinyl monomer having a carboxyl group include (meth)acrylic acid, vinylbenzoic acid, maleic acid, maleic acid monoalkyl ester, fumaric acid, itaconic acid, crotonic acid, cinnamic acid, and acrylic acid dimers. Further, adducts formed by addition reaction of a monomer having a hydroxyl group such as 2-hydroxyethyl(meth)acrylate with a cyclic anhydride such as maleic anhydride, phthalic anhydride or cyclohexane dicarboxylic anhydride, ω-carboxy-polycaprolactone mono(meth)acrylate, and the like may also be used. Furthermore, a monomer containing such anhydride as maleic anhydride, itaconic anhydride, or citraconic anhydride as a precursor of a carboxyl group may also be used. Among these, from the standpoint of copolymerization properties, cost, solubility or the like, (meth)acrylic acid is particularly preferable.

Examples of the vinyl monomer having a sulfonic acid group include 2-acrylamide-2-methylpropane sulfonate. Examples of the vinyl monomer having a phosphoric acid group include mono(2-acryloyloxyethylester)phosphate and mono(1-methyl-2-acryloyloxyethylester)phosphate.

Examples of the monomer having a basic nitrogen atom include monomers having a heterocycle such as vinyl pyridine, vinyl imidazole, or vinyl triazole; (meth)acrylic acid esters such as N,N-dimethylaminoethyl(meth)acrylate, N,N-dimethylaminopropyl(meth)acrylate, 1-(N,N-dimethylamino)-1,1-dimethyl methyl(meth)acrylate, N,N-dimethylaminohexyl(meth)acrylate, N,N-diethylaminoethyl(meth)acrylate, N,N-diisopropylaminoethyl(meth)acrylate, N,N-di-n-butylaminoethyl(meth)acrylate, N,N-di-1-butylaminoethyl(meth)acrylate, morpholinoethyl(meth)acrylate, piperidinoethyl(meth)acrylate, 1-pyrrolidinoethyl(meth)acrylate, N,N-methyl-2-pyrrolidylaminoethyl(meth)acrylate, or N,N-methylphenylaminoethyl(meth)acrylate; (meth)acrylamides such as N—(N',N'-dimethylaminoethyl)acrylamide, N—(N',N'-dimethylaminoethyl)methacrylamide, N—(N',N'-diethylaminoethyl)acrylamide, N—(N',N'-diethylaminoethyl)methacrylamide, N—(N',N'-dimethylaminopropyl)acrylamide, N—(N',N'-dimethylaminopropyl)methacrylamide, N—(N',N'-diethylaminopropyl)acrylamide, N—(N',N'-diethylaminopropyl)methacrylamide, 2-(N,N-dimethylamino)ethyl(meth)acrylamide, 2-(N,N-diethylamino)ethyl(meth)acrylamide, 3-(N,N-diethylamino)propyl(meth)acrylamide, 3-(N,N-dimethylamino)propyl(meth)acrylamide, 1-(N,N-dimethylamino)-1,1-dimethyl methyl(meth)acrylamide, 6-(N,N-diethylamino)hexyl(meth)acrylamide, morpholino(meth)acrylamide, piperidino(meth)acrylamide, N-methyl-2-pyrrolidyl(meth)acrylamide; and styrenes such as N,N-dimethylaminostyrene or N,N-dimethylaminomethylstyrene.

It is also possible to use a monomer having a urea group, a urethane group, a group having a coordinative oxygen atom, a hydrocarbon group having 4 or more carbon atoms, alkoxysilyl group, epoxy group or isocyanate group, or a hydroxyl group. Specific examples of these include monomers having the following structures.

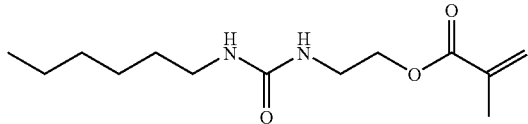

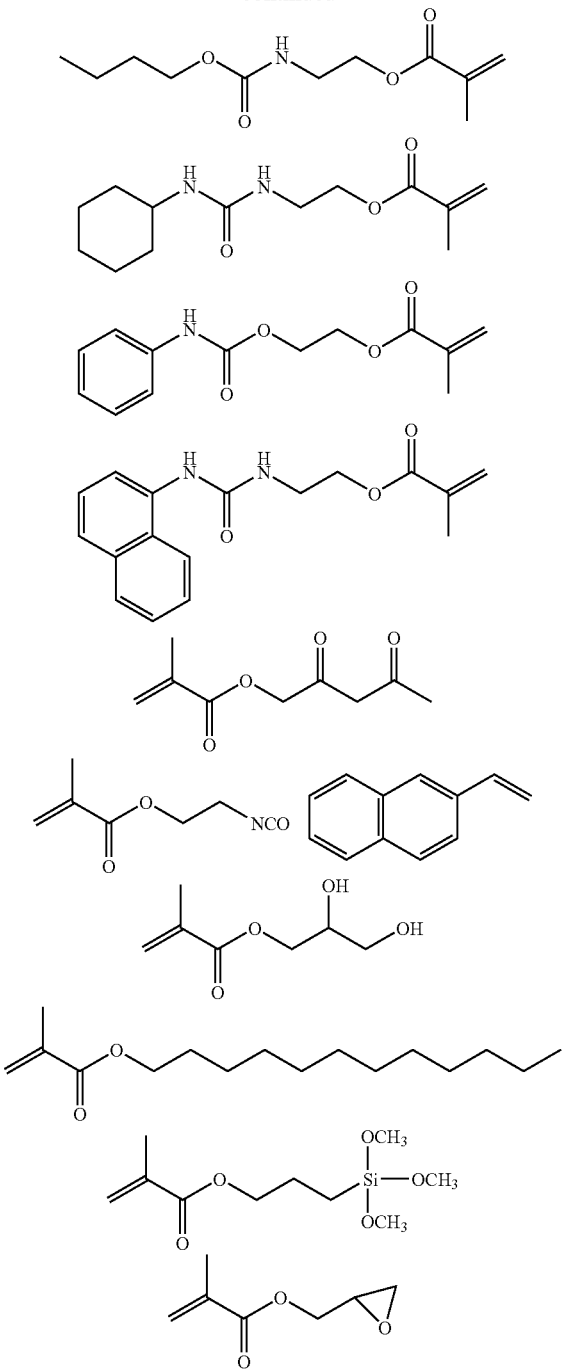

Further, a monomer containing an ionic functional group may also be used. Examples of ionic vinyl monomers (i.e., anionic vinyl monomers and cationic vinyl monomers) include anionic vinyl monomers such as alkali metal salts of the vinyl monomer having an acidic group or organic amine (for example, tertiary amines such as triethylamine or dimethylamino ethanol) salts of the vinyl monomer having an acidic group; and cationic vinyl monomers such as quarternized products of the nitrogen-containing vinyl monomer with a halogenated alkyl (in which the alkyl group has 1 to 18 carbon atoms, and the halogen atom is a chlorine atom, a bromine atom or an iodine atom), a halogenated benzyl such as benzyl chloride or benzyl bromide, an alkyl sulfonate (in which the alkyl group has 1 to 18 carbon atoms) such as methane sulfonate, an aryl sulfonic acid alkyl ester (in which the alkyl group has 1 to 18 carbon atoms) such as benzene sulfonate or toluene sulfonate, dialkyl sulfate (in which the alkyl group has 1 to 4 carbon atom), or the like; and dialkyl-diallylammonium salts.

The monomer having a functional group capable of being adsorbed onto the pigment may appropriately be selected in accordance with the type of pigment to be dispersed. The monomer having a functional group may be used singly, or in combination of two or more thereof.

Examples of monomers that constitute a block which is not adsorbed onto the pigment include, but not particularly limited to, (meth)acrylic acid esters, crotonic acid esters, vinyl esters, maleic acid diesters, fumaric acid diesters, itaconic acid diesters, (meth)acrylamides, styrenes, vinyl ethers, vinyl ketones, olefins, maleimides, and (meth)acrylonitrile. These monomers may be used singly, or in combination of two or more thereof. When a photocurable composition that requires an alkali development treatment is to be produced, the monomer that constitutes a block which is not adsorbed onto the pigment and a vinyl monomer having an acidic group may be used in combination.

Examples of (meth)acrylic acid esters include methyl (meth)acrylate, ethyl(meth)acrylate, n-propyl(meth)acrylate, isopropyl(meth)acrylate, n-butyl(meth)acrylate, isobutyl (meth)acrylate, t-butyl(meth)acrylate, amyl(meth)acrylate, n-hexyl(meth)acrylate, cyclohexyl(meth)acrylate, t-butylcyclohexyl(meth)acrylate, 2-ethylhexyl(meth)acrylate, t-octyl (meth)acrylate, dodecyl(meth)acrylate, octadecyl(meth) acrylate, acetoxyethyl(meth)acrylate, phenyl(meth)acrylate, 4-hydroxybutyl(meth)acrylate, 2-methoxyethyl(meth)acrylate, 2-ethoxyethyl(meth)acrylate, 2-(2-methoxyethoxy) ethyl(meth)acrylate, 2-chloroethyl(meth)acrylate, vinyl (meth)acrylate, 2-phenylvinyl(meth)acrylate, 1-propenyl (meth)acrylate, allyl(meth)acrylate, 2-allyloxyethyl(meth) acrylate, propargyl(meth)acrylate, benzyl(meth)acrylate, diethylene glycol monomethyl ether(meth)acrylate, diethylene glycol monoethyl ether(meth)acrylate, triethylene glycol monomethyl ether(meth)acrylate, triethylene glycol monoethyl ether(meth)acrylate, polyethylene glycol monomethyl ether(meth)acrylate, polyethylene glycol monoethyl ether (meth)acrylate, β-phenoxyethoxyethyl(meth)acrylate, nonyl phenoxy polyethylene glycol(meth)acrylate, dicyclopentenyl (meth)acrylate, dicyclopentenyl oxyethyl(meth)acrylate, trifluoroethyl(meth)acrylate, octafluoropentyl(meth)acrylate, perfluorooctyl ethyl(meth)acrylate, dicyclopentanyl(meth) acrylate, tribromophenyl(meth)acrylate, tribromophenyl oxyethyl(meth)acrylate, and γ-butyrolactone(meth)acrylate.

Examples of crotonic acid esters include butyl crotonate and hexyl crotonate.

Examples of vinyl esters include vinyl acetate, vinyl chloroacetate, vinyl propionate, vinyl butyrate, vinyl methoxy acetate, and vinyl benzoate.

Examples of maleic acid diesters include dimethyl maleate, diethyl maleate, and dibutyl maleate.

Examples of fumaric acid diesters include dimethyl fumarate, diethyl fumarate, and dibutyl fumarate.

Examples of itaconic acid diesters include dimethyl itaconate, diethyl itaconate, and dibutyl itaconate.

Examples of (meth)acrylamides include (meth)acrylamide, N-methyl(meth)acrylamide, N-ethyl(meth)acrylamide, N-propyl(meth)acrylamide, N-isopropyl(meth)acrylamide, N-n-butyl(meth)acrylamide, N-t-butyl(meth) acrylamide, N-cyclohexyl(meth)acrylamide, N-(2-methoxyethyl)(meth)acrylamide, N,N-dimethyl(meth) acrylamide, N,N-diethyl(meth)acrylamide, N-phenyl(meth) acrylamide, N-nitrophenylacrylamide, N-ethyl-N-phenylacrylamide, N-benzyl(meth)acrylamide, (meth) acryloyl morpholine, diacetone acrylamide, N-methylolacrylamide, N-hydroxyethyl acrylamide, vinyl (meth)acrylamide, N,N-diallyl(meth)acrylamide, and N-allyl(meth)acrylamide.

Examples of styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected with a group (such a t-Boc) deprotectable with an acidic substance, methyl vinyl benzoate, and α-methyl styrene.

Examples of vinyl ethers include methyl vinyl ether, ethyl vinyl ether, 2-chloroethyl vinyl ether, hydroxyethyl vinyl ether, propyl vinyl ether, butyl vinyl ether, hexyl vinyl ether, octyl vinyl ether, methoxy ethyl vinyl ether, and phenyl vinyl ether.

Examples of vinyl ketones include methyl vinyl ketone, ethyl vinyl ketone, propyl vinyl ketone, and phenyl vinyl ketone.

Examples of olefins include ethylene, propylene, isobutylene, butadiene, and isoprene.

Examples of maleimides include maleimide, butyl maleimide, cyclohexyl maleimide, and phenyl maleimide.

Examples of (meth)acrylonitriles include methacrylonitrile, and acrylonitrile.

Examples of vinyl monomers having an acidic group include vinyl monomers having a carboxyl group and vinyl monomers having a sulfonic acid group.

Examples of the vinyl monomers having a carboxyl group include (meth)acrylic acid, vinylbenzoic acid, maleic acid, maleic acid monoalkyl ester, fumaric acid, itaconic acid, crotonic acid, cinnamic acid, and acrylic acid dimers. Further, adducts formed by addition reaction of a monomer having a hydroxyl group such as 2-hydroxyethyl(meth)acrylate with a cyclic anhydride such as maleic anhydride, phthalic anhydride or cyclohexane dicarboxylic anhydride, ω-carboxy-polycaprolactone mono(meth)acrylate, and the like may also be used. Furthermore, a monomer containing such anhydride as maleic anhydride, itaconic anhydride, or citraconic anhydride as a precursor of a carboxyl group may also be used. Among these, from the standpoint of copolymerization properties, cost, solubility or the like, (meth)acrylic acid is particularly preferable.

Examples of the vinyl monomers having a sulfonic acid group include 2-acrylamide-2-methylpropane sulfonate. Examples of vinyl monomers having a phosphoric acid group include mono(2-acryloyloxyethylester) phosphate and mono (1-methyl-2-acryloyloxyethylester) phosphate.

Further, as the vinyl monomer having an acidic group, vinyl monomers containing a phenolic hydroxyl group, vinyl monomers containing a sulfonamide group, or the like may also be used.

The block polymer in the invention may be obtained by a known method such as a living polymerization method or an iniferter technique. In addition, another method is known in which, upon subjecting a monomer having a pigment adsorbing group or a monomer having no pigment adsorbing group to radical polymerization, the polymerization is performed in coexistence with a compound containing a thio ester and a thiol group in a molecule thereof, such as thiolcarboxylic acid, 2-acetylthio ethyl ether, or 10-acetylthiodecane thiol; the obtained polymer is treated with alkali such as sodium hydroxide or ammonia to form a polymer having a thiol group at one end; and, in the existence of the polymer having a thiol group at one end, the monomer component of another block is subjected to radical polymerization. Among these, the living polymerization method is preferable.

The weight average molecular weight of the block polymer is not particularly limited, but it is preferably within a range from 3,000 to 100,000, and more preferably within a range from 5,000 to 50,000. The weight average molecular weight of 3,000 or more can provide the stabilization effect more effectively, and the weight average molecular weight of 100,000 or less enables more effective adsorption and good dispersibility.

As the block polymer, a commercially available product may also be used. Specific examples thereof include Disperbyk-2000, Disperbyk-2001 (both trade names, manufactured by BYK Chemie), and EFKA4330, EFKA4340 (both trade names, manufactured by EFKA).

Graft Polymer

The graft type polymer is not particularly limited, but examples thereof include compounds obtained by reacting polyalkyleneimine with a polyester compound, such as those described in JP-A No. 54-37082 or 61-174939; compounds obtained by modifying an amino group in a side chain of polyallylamine with polyester, such as those described in JP-A No. 9-169821; polyester polyol-added polyurethane such as those described in JP-A No. 60-166318; and a graft polymer having a polymerizable oligomer (hereinafter, called a macromonomer) as a copolymerization component, such as those described in JP-A No. 9-171253 or "Chemistry and Industry of Macromonomer (Macromonomer no Kagaku to Kogyo)" (IPC Publication Section, 1989).

The graft polymer preferably has a graft portion of polystyrene, polyethylene oxide, polypropylene oxide, poly(meth)acrylate, polycaprolactone or the like, and a graft polymer at least having a constitutional unit represented by the following Formula (5) on a graft portion is more preferable.

Formula (5)

In Formula (5), $R^{74}$ represents a hydrogen atom or an alkyl group having 1 to 8 carbon atoms, and Q represents a cyano group, an aryl group having 6 to 30 carbon atoms, or —COOR$^{75}$ (in which $R^{75}$ represents a hydrogen atom, an alkyl group having 1 to 22 carbon atoms, or an aryl group having 6 to 30 carbon atoms).

In Formula (5), the alkyl group represented by $R^{74}$ may have a substituent, and is preferably an alkyl group having 1 to 6 carbon atoms, and particularly preferably a methyl group. Examples of the substituent of the alkyl group include a halogen atom, a carboxyl group, an alkoxycarbonyl group, and an alkoxy group. Specific examples of such an alkyl group include a methyl group, an ethyl group, a hexyl group, an octyl group, a trifluoromethyl group, a carboxymethyl group, and a methoxy carbonyl methyl group. Among these $R^{74}$, a hydrogen atom and a methyl group are preferable.

In Formula (5), an aryl group represented by Q may have a substituent, and is preferably an aryl group having 6 to 20 carbon atoms, and particularly preferably an aryl group having 6 to 12 carbon atoms. Examples of the substituent of the aryl group include a halogen atom, an alkyl group, an alkoxy group, and an alkoxycarbonyl group. Specific examples of such an aryl group include a phenyl group, a naphthyl group, a tolyl group, a xylyl group, a propylphenyl group, a butylphenyl group, an octylphenyl group, a dodecylphenyl group, a methoxyphenyl group, an ethoxyphenyl group, a butoxyphenyl group, a decyloxyphenyl group, a chlorophenyl group, a dichlorophenyl group, a bromophenyl group, a methoxycarbonylphenyl group, an ethoxycarbonylphenyl group, and a butoxycarbonylphenyl group. Among these aryl groups, unsubstituted aryl groups, or aryl groups substituted by a halogen atom, an alkyl group, or an alkoxy group are preferable, and unsubstituted aryl groups, or aryl groups substituted by an alkyl group are particularly preferable.

In —COOR$^{75}$ represented by Q in Formula (5), an alkyl group represented by $R^{75}$ may have a substituent, and is preferably an alkyl group having 1 to 12 carbon atoms, and particularly preferably an alkyl group having 1 to 8 carbon atoms. Examples of the substituent of the alkyl group include a halogen atom, an alkenyl group, an aryl group, a hydroxyl group, an alkoxy group, an alkoxycarbonyl group, an amino group, an acylamino group, and a carbamoyl group. Specific examples of such an alkyl group include a methyl group, an ethyl group, a propyl group, a butyl group, a heptyl group, a hexyl group, an octyl group, a decyl group, a dodecyl group, a tridecyl group, a tetradecyl group, a hexadecyl group, an octadecyl group, a 2-chloroethyl group, a 2-bromoethyl group, a 2-methoxycarbonylethyl group, a 2-methoxyethyl group, a 2-bromopropyl group, a 2-butenyl group, 2-pentenyl group, a 3-methyl-2-pentenyl group, a 2-hexenyl group, a 4-methyl-2-hexenyl group, a benzyl group, a phenethyl group, a 3-phenylpropyl group, a naphthylmethyl group, a 2-naphthylethyl group, a chlorobenzyl group, a bromobenzyl group, a methylbenzyl group, an ethylbenzyl group, a methoxybenzyl group, a dimethylbenzyl group, a dimethoxybenzyl group, a cyclohexyl group, a 2-cyclohexylethyl group, a 2-cyclopentylethyl group, a bicyclo[3.2.1]octo-2-yl group, a 1-adamantyl group, a dimethylaminopropyl group, an acetylaminoethyl group, and an N,N-dibutylaminocarbamoylmethyl group. Among these alkyl groups, unsubstituted alkyl groups, or alkyl groups substituted by a halogen atom, an aryl group, or a hydroxyl group are preferable, and unsubstituted alkyl groups are particularly preferable.

In —COOR$^{75}$ represented by Q in Formula (5), an aryl group represented by $R^{75}$ may have a substituent, and is preferably an aryl group having 6 to 20 carbon atoms, and particularly preferably an aryl group having 6 to 12 carbon atoms. Examples of the substituent of the aryl group include a halogen atom, an alkyl group, an alkenyl group, an alkoxy group, an alkoxycarbonyl group, and an acylamino group. Specific examples of such an aryl group include a phenyl group, a naphthyl group, a tolyl group, a xylyl group, a propylphenyl group, a butylphenyl group, an octylphenyl group, a dodecylphenyl group, a methoxyphenyl group, an ethoxyphenyl group, a butoxyphenyl group, a decyloxyphenyl group, a chlorophenyl group, a dichlorophenyl group, a bromophenyl group, a methoxycarbonylphenyl group, an ethoxycarbonylphenyl group, a butoxycarbonylphenyl group, an acetamidophenyl group, a propioamidophenyl group, and a dodecyloylamidophenyl group. Among these aryl groups, unsubstituted aryl groups, or aryl groups substituted by a halogen atom, an alkyl group or an alkoxy group are preferable, and aryl groups substituted by an alkyl group are particularly preferable.

Among these $R^{75}$, a hydrogen atom and an alkyl group having 1 to 22 carbon atoms are preferable, and a hydrogen atom and an alkyl group having 1 to 12 carbon atoms are particularly preferable.

Specific examples of a graft portion of graft polymers at least having a constitutional unit represented by Formula (5)

in the graft portion include polymethyl(meth)acrylate, poly-n-butyl(meth)acrylate, poly-i-butyl(meth)acrylate, a copolymer of methyl(meth)acrylate and benzyl(meth)acrylate, a copolymer of methyl(meth)acrylate and styrene, a copolymer of methyl(meth)acrylate and (meth)acrylic acid, and a copolymer of methyl(meth)acrylate and acrylonitrile.

For synthesizing a graft polymer having the constitutional unit represented by Formula (5) at least on a branch portion, any known method may be used.

Specifically, copolymerization of a macromonomer having at least the constitutional unit represented by Formula (5) and an ethylenically unsaturated monomer copolymerizable with the macromonomer is mentioned.

Among macromonomers having at least the constitutional unit represented by Formula (5), preferable are those represented by the following Formula (6).

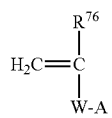

Formula (6)

In Formula (6), $R^{76}$ represents a hydrogen atom or an alkyl group having 1 to 8 carbon atoms, and W represents a single bond or a single linking group selected from the following atomic groups or a linking group formed by a combination of two or more of the following atomic groups:

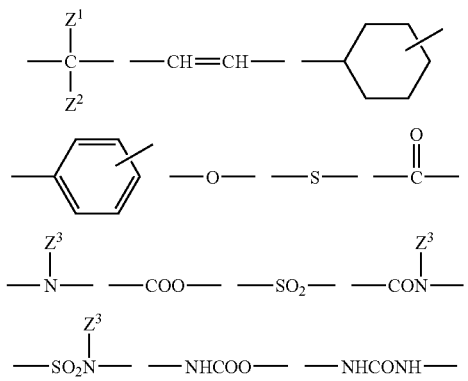

in which, $Z^1$ and $Z^2$ each independently represent a hydrogen atom, a halogen atom, an alkyl group having 1 to 6 carbon atoms, a cyano group, or a hydroxyl group, and $Z^3$ represents a hydrogen atom, an alkyl group having 1 to 18 carbon atoms, or an aryl group having 6 to 20 carbon atoms; and A represents a group having at least the constitutional unit represented by Formula (5).

Specific examples of such macromonomers represented by Formula (6) include those shown below.

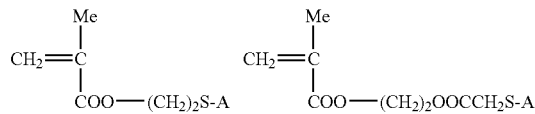

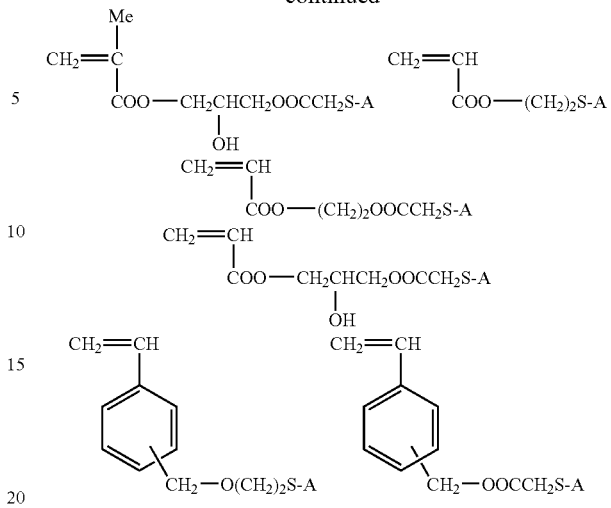

"A" in these structures has the same meaning as that of "A" in Formula (6).

Examples of such macromonomers which may be obtained as commercially available products include a one-terminal methacryloylated polymethyl methacrylate oligomer (Mn=6,000, trade name: AA-6, manufactured by TOAGOSEI CO., LTD.), a one-terminal methacryloylated poly-n-butyl acrylate oligomer (Mn=6,000, trade name: AB-6, manufactured by TOAGOSEI CO., LTD.), and a one-terminal methacryloylated polystyrene oligomer (Mn=6,000, trade name: AS-6, manufactured by TOAGOSEI CO., LTD.).

The macromonomer has a number average molecular weight (Mn) in terms of polystyrene of preferably from 1,000 to 20,000, and more preferably from 2,000 to 15,000. The number average molecular weight within the above range can more effectively provide steric repulsion effect as a pigment dispersant.

As the ethylenically unsaturated monomer copolymerizable with the macromonomer, the "monomer that constitutes a block which is adsorbed onto pigment" is preferably used, for the purpose of improving the dispersibility and the dispersion stability. Further, as another copolymerization component, the "monomer that constitutes a block which is not adsorbed onto pigment" may also be copolymerized.

The weight average molecular weight of the graft polymer is, but not particularly limited to, preferably within the range from 3,000 to 100,000, and more preferably within the range from 5,000 to 50,000. The weight average molecular weight of 3,000 or more enables the stabilization effect to be obtained more effectively, and the weight average molecular weight of 100,000 or less enables more effective adsorption and excellent dispersibility.

Examples of the commercially available graft polymers include SOLSPERSE 24000, 28000, 32000, 38500, 39000, and 55000 (all trade names, manufactured by The Lubrizol Corporation), and Disperbyk-161, -171, and -174 (all trade names, manufactured by BYKChemie).

End-Modified Polymer

Examples of the end-modified polymers include polymers having a functional group at the end thereof, such as those described in JP-A No. 9-77994 or 2002-273191.

Although a method for synthesizing a polymer having a functional group at the end of the polymer is not particularly limited, for example, the polymer may be produced by any of the methods described below or a combination of those methods.

1. A synthesis method in which polymerization (for example, radical polymerization, anion polymerization, or cation polymerization) is performed using a polymerization initiator containing a functional group.

2. A synthesis method in which radical polymerization is performed using a chain transfer agent containing a functional group.

Examples of the functional group introduced in the above methods include moieties selected from the group consisting of an organic dye structure, a heterocyclic structure, an acidic group, a group having a basic nitrogen atom, a urea group, a urethane group, a group having a coordinative oxygen atom, a hydrocarbon group having 4 or more carbon atoms, an alkoxysilyl group, an epoxy group, an isocyanate group, a hydroxyl group, an ionic functional group, and the like. Further, functional groups that can be induced to these adsorption sites may also be used.

Examples of chain transfer agents capable of introducing a functional group to a polymer end include mercapto compounds (for example, thioglycolic acid, thiomalic acid, thiosalicylic acid, 2-mercaptopropionic acid, 3-mercaptopropionic acid, 3-mercaptobutyric acid, N-(2-mercaptopropionyl)glycine, 2-mercaptonicotine acid, 3-[N-(2-mercaptoethyl)carbamoyl]propionic acid, 3-[N-(2-mercaptoethyl)amino]propionic acid, N-(3-mercaptopropionyl)alanine, 2-mercaptoethanesulfonic acid, 3-mercaptopropanesulfonic acid, 4-mercaptobutanesulfonic acid, 2-mercapto ethanol, 3-mercapto-1,2-propanediol, 1-mercapto-2-propanol, 3-mercapto-2-butanol, mercaptophenol, 2-mercaptoethylamine, 2-mercaptoimidazole, 2-mercapto-3-pyridinol, benzenethiol, toluenethiol, mercaptoacetophenone, naphthalene thiol, or naphthalenemethanethiol), disulfide compounds which are oxidized products of these mercapto compounds, and halogen compounds (for example, 2-iodoethanesulfonic acid or 3-iodopropanesulfonic acid).

Examples of polymerization initiators capable of introducing a functional group to a polymer end include 2,2'-azobis (2-cyanopropanol), 2,2'-azobis(2-cyanopentanol), 4,4'-azobis(4-cyanovaleric acid), 4,4'-azobis(4-cyanovaleric acid chloride), 2,2'-azobis[2-(5-methyl-2-imidazolin-2-yl)propane], 2,2'-azobis[2-(2-imidazolin-2-yl)propane], 2,2'-azobis[2-(3,4,5,6-tetrahydropyrimidin-2-yl)propane], 2,2'-azobis{2-[1-(2-hydroxyethyl)-2-imidazolin-2-yl]propane}, 2,2'-azobis[2-methyl-N-(2-hydroxyethyl)-propionamide], and derivatives thereof.

Examples of monomers to be used in the polymerization include, as a radical polymerizable monomer, the "monomer that constitutes a block which is not adsorbed to pigment."

The weight average molecular weight of the end-modified polymer is preferably from 1,000 to 50,000. The weight average molecular weight of 1,000 or more can provide more effectively the steric repulsion effect as a pigment dispersant, and that of 50,000 or less can suppress more effectively the steric repulsion to more shorten the time for adsorption to pigment.

Examples of commercially available end-modified polymers include SOLSPERSE 3000, 17000, and 27000 (all trade names, manufactured by The Lubrizol Corporation).

As the dispersant, the high molecular-weight compound having a heterocycle in a side chain thereof, the graft polymer, and the end-modified polymer are preferable. Among these, graft polymers containing a copolymerization unit derived from a monomer having an organic dye structure or a heterocyclic structure, and end-modified polymers having, as an end group, an organic dye structure, a heterocyclic structure, an acidic group or group containing a basic nitrogen atom or an urethane group are particularly preferable.

In the case of the polymer dispersant, the dispersant is added in an amount preferably from 0.5 to 100% by weight, more preferably from 3 to 100% by mass, and particularly preferably from 5 to 80% by mass, with respect to the pigment. The amount of the pigment dispersant within the range can give sufficient pigment dispersion effect. However, the optimal amount of the dispersant is appropriately adjusted according to a combination of the type of pigment to be used, the type of the solvent, and the like.

The ratio between the high molecular-weight compound having a heterocycle in a side chain thereof, which coats the pigment, and the dispersant (i.e., high molecular-weight compound/dispersant) is not particularly limited. However, when the dispersant is a polymer dispersant, the ratio is preferably from 10/90 to 90/10 in mass ratio, and particularly preferably from 20/80 to 80/20 in mass ratio.

Preparation of Pigment Dispersion Composition

In a preferable embodiment of the invention, a pigment dispersion composition includes the processed pigment covered with the high molecular-weight compound having a heterocycle in a side chain thereof and a solvent, in which the processed pigment is dispersed in the solvent with, according to need, an additional dispersant or alkali-soluble resin.

The processed pigment and the solvent, and, if required, an additional dispersant and/or alkali-soluble resin, are subjected to kneading and dispersion. In the dispersion, mainly, a vertical or horizontal sand grinder, a pin mill, a slit mill, or an ultrasonic dispersing machine is used to perform fine dispersion treatment with beads made of glass, zirconia or the like having a particle diameter of from 0.01 to 1 mm, to give a pigment dispersion composition. Before performing beads dispersion, it is also possible to perform a kneading dispersion treatment using a two-roll mill, a three-roll mill, a ball mill, a trommel, a DISPER, a kneader, a co-kneader, a homogenizer, a blender, or a uniaxial or biaxial extruder while applying strong shear force.

Details of kneading and dispersion is described in T. C. Patton "Paint Flow and Pigment Dispersion" (John Wiley and Sons, 1964), and the like.

The colored curable composition of the invention can be prepared by mixing an alkali-soluble resin, a photopolymerizable compound, and a photopolymerization initiator (preferably with a solvent) with the processed pigment subjected to a coating treatment with the high molecular-weight compound having a heterocycle in a side chain thereof, mixing an additive such as a surfactant, according to need, and subjecting to a mixing and dispersion process in which mixing and dispersion are performed using any of various kinds of mixers or dispersing machines.

The pigment dispersion of the invention is favorably used for colored curable compositions for use in producing color filters.

Sensitizer

The colored curable composition of the invention may include a sensitizer for a purpose of improving the radical generation efficiency of a radical initiator, or shifting the photosensitive wavelength to a longer wavelength. Sensitizers usable in the invention are preferably those that sensitize the photopolymerization initiator through an electron transfer mechanism or an energy transfer mechanism.

Examples of the sensitizers usable in the invention include those that belong to compounds cited below and absorb light in the wavelength region from 300 nm to 450 nm.

Examples of preferable sensitizers include those that belong to compounds cited below and absorb light in the wavelength region from 330 nm to 450 nm.

Examples thereof include polynuclear aromatics (for example, phenanthrene, anthracene, pyrene, perylene, triphenylene, 9,10-dialkoxyanthracene), xanthenes (for example, fluorescein, eosin, erythrosin, rhodamine B, rose bengal), thioxantones (isopropyl thioxantone, diethyl thioxantone, chlorothioxantone), cyanines (for example, thiacarbocyanine, oxacarbocyanine), merocyanines (for example, merocyanine, carbomerocyanine), phthalocyanines, thiazines (for example, thionine, methylene blue, toluidine blue), acridines (for example, acridine orange, chloroflavine, acriflavine), anthraquinones (for example, anthraquinone), squaryliums (for example, squarylium), acridine orange, coumarins (for example, 7-diethylamino-4-methyl coumarin), ketocoumarin, phenothiazines, phenazines, styrylbenzenes, azo compounds, diphenylmethane, triphenylmethane, distyrylbenzenes, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, thioxantone or Michler's ketone, heterocyclic compounds such as N-aryloxazolidinone; and compounds such as those described in EP-A No. 568,993, U.S. Pat. No. 4,508,811 or 5,227,227, or JP-A No. 2001-125255 or 11-271969.

The sensitizers may be used singly, or in combination of two or more thereof.

The amount of the sensitizer in the colored curable composition of the invention is preferably from 0.1 to 20% by mass, and more preferably from 0.5 to 15% by mass, in terms of the solid content, from the standpoint of a light absorption efficiency to deep portions and a decomposition efficiency of the polymerization initiator.

Co-Sensitizer

The colored curable composition of the invention may favorably include a co-sensitizer. In the invention, the co-sensitizer has such action as further improving sensitivity of a sensitizing dye or an initiator for actinic radiation, suppressing polymerization inhibition of polymerizable compounds (such as a specific monomer) by oxygen, or the like.

Examples of such co-sensitizers include amines, for example, compounds such as those described in M. R. Sander et al, "Journal of Polymer Society" vol. 10, p 3173 (1972), JP-B No. 44-20189, JP-A No. 51-82102, 52-134692, 59-138205, 60-84305, 62-18537 or 64-33104, or Research Disclosure No. 33825. Specific examples of the co-sensitizers include triethanolamine, p-dimethylamino benzoic acid ethyl ester, p-formyldimethylaniline, and p-methylthiodimethylaniline.

Other examples of the co-sensitizers include thiols and sulfides, such as thiol compounds as those described in JP-A No. 53-702 or 5-142772, or JP-B No. 55-500806, and disulfide compounds described in JP-A No. 56-75643. Specific examples thereof include 2-mercaptobenzothiazole, 2-mercaptobenzoxazole, 2-mercaptobenzoimidazole, 2-mercapto-4(3H)-quinazoline, and β-mercaptonaphthalene.

Other examples of the co-sensitizers include amino acid compounds (such as N-phenyl glycine), organic metal compounds as those described in JP-B No. 48-42965 (such as tributyl tin acetate), hydrogen donors such as those described in JP-B No. 55-34414, and sulfur compounds such as those described in JP-A No. 6-308727 (such as trithiane).

The amount of these co-sensitizers is preferably within the range from 0.1 to 30% by mass, more preferably within the range from 1 to 25% by mass, and further preferably within the range from 1.5 to 20% by mass, with respect to the mass of the total solid of the colored curable composition, from the standpoint of improving curing speed owing to the balance between polymerization growth speed and chain transfer.

Polymerization Inhibitor

In the invention, it is preferable to add a small amount of a thermal polymerization inhibitor, in order to prevent unnecessary thermal polymerization of a compound having a polymerizable ethylenically unsaturated double bond during the production or storage of the colored curable composition.

Examples of thermal polymerization inhibitors usable in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine cerium (I) salt.

The amount of the thermal polymerization inhibitor to be added is preferably from about 0.01% by mass to about 5% by mass with respect to the mass of the entire composition. Further, a higher fatty acid derivative such as behenic acid or behenic amide may be added, according to need, to allow it to exist locally near the surface of a photosensitive layer in a drying process after coating, in order to prevent polymerization inhibition caused by oxygen. The amount of the higher fatty acid derivative to be added is preferably form about 0.5% by mass to about 10% by mass with respect to the entire composition.

Thermal Polymerizable Component

It is also effective to incorporate a thermal polymerizable component into the pigment dispersion composition of the invention. An epoxy compound may be added, if necessary, in order to increase the strength of a coating film. Examples of the epoxy compound include compounds having two or more epoxy rings in a molecule thereof, such as a bisphenol A compound, a cresol novolac compound, a biphenyl compound, or an alicyclic epoxy compound. Examples of the bisphenol A compound include EPOTOTO YD-115, YD-118T, YD-127, YD-128, YD-134, YD-8125, YD-7011R, ZX-1059, YDF-8170, YDF-170, and the like (all trade names, manufactured by Tohto Kasei Co., Ltd.), DENACOL EX-1101, EX-1102, EX-1103, and the like (all trade names, manufactured by Nagase Chemtex Corporation), PLACCELL GL-61, GL-62, G101, and G102 (all trade names, manufactured by Daicel Chemical Industries), and bisphenol F compounds and bisphenol S compounds, which are similar to the bisphenol A compound. Further, epoxy acrylate such as EBECRYL 3700, 3701, or 600 (all trade names, manufactured by Daicel-Cytec Company Ltd.) is also usable. Examples of the cresol novolak compound include EPOTOTO YDPN-638, YDPN-701, YDPN-702, YDPN-703, YDPN-704, and the like (all trade names, manufactured by Tohto Kasei Co., Ltd.), and DENACOL EM-125 and the like (manufactured by Nagase Chemtex Corporation). Examples of the biphenyl compound include 3,5,3',5'-tetramethyl-4,4'-diglycidylbiphenyl. Examples of the alicyclic epoxy compound include CELLOXIDE 2021, 2081, 2083, 2085, EPOLEAD GT-301, GT-302, GT-401, GT-403, EHPE-3150 (all trade names, manufactured by Daicel Chemical Industries), and SUNTOHTO ST-3000, ST-4000, ST-5080, ST-5100 and the like (all trade names, manufactured by Tohto Kasei Co., Ltd.). Further, 1,1,2,2-tetrakis(p-glycidyloxyphenyl)ethane, tris(p-glycidyloxyphenyl)methane, triglycidyl tris(hydroxyethyl)isocyanurate, o-phthalic acid diglycidyl ester, terephthalic acid diglycidyl ester, and, in addition, EPOTOTO YH-434 and YH-434L, which are amine epoxy resins, and glycidyl ester formed by modifying the skeleton of a bisphenol A epoxy resin with a dimer acid are also usable.

Surfactant

The pigment dispersion composition of the invention is preferably formed by using any of various types of surfactants from the standpoint of improving coating properties. Examples of usable surfactants include fluorine-containing surfactants, nonionic surfactants, cationic surfactants, and anionic surfactants. Among these, the fluorine-containing surfactant and the nonionic surfactant are preferable.

As the nonionic surfactant, for example, nonionic surfactants such as polyoxyethylene alkyl ethers, polyoxyethylene alkyl aryl ethers, polyoxyethylene alkyl esters, sorbitan alkyl esters, and monoglyceride alkyl esters are particularly preferable. Specific examples thereof include nonionic surfactants of polyoxyethylene alkyl ethers such as polyoxyethylene lauryl ether, polyoxyethylene stearyl ether, or polyoxyethyleneoleyl ether; polyoxyethylene aryl ethers such as polyoxyethylene octylphenyl ether, polyoxyethylene polystyrylated ether, polyoxyethylene tribenzyl phenyl ether, polyoxyethylene-propylene polystyryl ether, or polyoxyethylene nonylphenyl ether; polyoxyethylene dialkyl esters such as polyoxyethylene dilaurate, or polyoxyethylene distearate; sorbitan fatty acid esters, polyoxyethylene sorbitan fatty acid esters, ethylene diamine polyoxyethylene-polyoxypropylene condensate, and the like. These may be appropriately selected and used from those commercially available from, for example, Kao Corporation, NOF Corporation, TAKEMOTO OIL & FAT Co., Ltd., ADEKA CORPORATION, or Sanyo Chemical Industries, Ltd. In addition to these, the aforementioned dispersant may also be used as the surfactant.

Adhesion Improver

To the colored curable composition, an adhesion improver may be added in order to improve the adhesiveness between a hard surface of a support or the like, and a formed cured film. Examples of the adhesion improver include silane coupling agents and a titanium coupling agent.

Examples of the silane coupling agents include γ-(2-aminoethyl)aminopropyltrimethoxysilane, γ-(2-aminoethyl)aminopropyldimethoxysilane, β-(3,4-epoxycyclohexyl)ethyltrimethoxy silane, γ-aminopropyltrimethoxysilane, γ-aminopropyltriethoxysilane, γ-methacryloxypropyltrimethoxysilane, γ-methacryloxypropyltriethoxysilane, γ-acryloxypropyltrimethoxysilane, γ-acryloxypropyltriethoxysilane, γ-isocyanatepropyltrimethoxysilane, γ-isocyanatepropyltriethoxysilane, N-β-(N-vinylbenzylaminoethyl)-γ-aminopropyltrimethoxysilane hydrochloric acid salt, γ-glycidoxypropyltrimethoxysilane, γ-glycidoxypropyltriethoxysilane, aminosilane, γ-mercaptopropyltrimethoxysilane, γ-mercaptopropyltriethoxysilane, methyltrimethoxysilane, methyltriethoxysilane, vinyl triacetoxysilane, γ-chloropropyltrimethoxysilane, hexamethyldisilazane, γ-anilinopropyltrimethoxysilane, vinyltrimethoxysilane, vinyltriethoxysilane, vinyl tris(β-methoxyethoxy)silane, octadecyl dimethyl[3-(trimethoxysilyl)propyl]ammonium chloride, γ-chloropropylmethyldimethoxysilane, γ-mercaptopropylmethyldimethoxysilane, methyl trichlorosilane, dimethyl dichlorosilane, trimethyl chlorosilane, 2-(3,4-epoxycyclohexyl)ethyltrimethoxysilane, bisallyltrimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl)methyldiethoxysilane, and (acryloxymethyl)methyldimethoxysilane.

Among these, γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane are preferable, and γ-methacryloxypropyltrimethoxysilane is most preferable.

The amount of the adhesion improver to be added is preferably from 0.1 to 30% by mass, and more preferably from 0.5 to 20% by mass, with respect to the entire solid content of the colored curable composition.

Other Additives

In addition to the above, any of various additives may be added to the colored curable composition of the invention. Specific examples of the additives include an ultraviolet absorber such as 2-(3-t-butyl-5-methyl-2-hydroxyphenyl)-5-chlorobenzotriazole, or alkoxybenzophenone; an aggregation inhibitor such as sodium polyacrylate; a filler such as glass, or alumina; and an alkali soluble resin such as an itaconic acid copolymer, a crotonic acid copolymer, a maleic acid copolymer, a partially esterified maleic acid copolymer, an acidic cellulose derivative, a product formed by adding acid anhydride to a polymer having a hydroxyl group, alcohol-soluble nylon, a phenoxy resin formed from bisphenol A and epichlorohydrin.

Further, for the purpose of accelerating alkali solubility of uncured portions and further improving the development properties of the pigment dispersion composition, it is possible to add an organic carboxylic acid, preferably a low molecular weight organic carboxylic acid having a molecular weight of 1000 or less, upon preparing the (D) pigment dispersion liquid containing a pigment. Specific examples thereof include aliphatic monocarboxylic acid such as formic acid, acetic acid, propionic acid, butyric acid, valeric acid, pivalic acid, caproic acid, diethylacetic acid, enanthic acid or caprylic acid; aliphatic dicarboxylic acid such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, or citraconic acid; aliphatic tricarboxylic acid such as tricarballylic acid, aconitic acid, or camphoronic acid; aromatic monocarboxylic acid such as benzoic acid, toluic acid, cuminic acid, hemellitic acid, or mesitylenic acid; aromatic polycarboxylic acid such as phthalic acid, isophthalic acid, terephthalic acid, trimellitic acid, trimesic acid, mellophanic acid, or pyromellitic acid; and other carboxylic acids such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid, or umbellic acid.

Further, in the invention, any of known additives may be added, including an inorganic filler or a plasticizer which improves physical properties of a cured film, or a sensitizer capable of improving ink adhesion property of the surface of the photosensitive layer.

Examples of the plasticizer include dioctyl phthalate, didodecyl phthalate, triethylene glycol dicaprate, dimethyl glycol phthalate, tricresyl phosphate, dioctyladipate, dibutyl sebacate, and triacetyl glycerin. When a binding agent is used, the plasticizer may be added in and amount of 10% by mass or less with respect to the total mass of a compound having an ethylenically unsaturated double bond and the binding agent.

The colored curable composition of the invention cures with a high sensitivity and also has a good storage stability. Further, it shows a high adhesiveness to the surface of a hard material such as a substrate to which the colored curable composition is applied. Accordingly, the colored curable composition of the invention may favorably be used in fields of three-dimensional photo-fabrication, holography, image forming materials such as color filters, inks, paints, adhesives, and coating materials.

Preparation Method of Colored Curable Composition of the Invention

The colored curable composition of the invention may be prepared by mixing the (A) monomer containing an alkyleneoxy chain, the (B) binder polymer, the (C) photopolymerization initiator, and the (D) pigment including Pigment Red 166, and a dispersant or the like as required, with a solvent; adding thereto, as required, an additive such as a surfactant, and subjecting the mixture to a mixing and dispersion process in which mixing and dispersion is performed using any of various mixers and dispersion machines.

Alternatively, a dispersion liquid in which the (D) pigment including Pigment Red 166 is dispersed may previously prepared, which is then mixed with other components.

Although the mixing and dispersing process preferably includes a kneading and dispersing treatment and a subsequent fine dispersion treatment, the kneading and dispersing treatment may be omitted.

Color Filter

The color filter of the invention is formed by using the colored curable composition of the invention.

The color filter has, for example, a color pattern of at least one color (preferably, three or four colors) formed by using the colored curable composition of the invention on a support described later.

The color filter of the invention is formed using the colored curable composition of the invention, which satisfies desired transmittance properties (i.e., capable of suppressing the local increase in transmittance near 530 nm, when formed into a red color filter), has excellent resolving power, reduces development residues and has excellent long-term viscosity stability. Therefore, the filter has excellent color properties and high resolving power.

The color filter of the invention may be used as a color filter for liquid crystal display devices, or as a color filter for solid-state imaging devices. From the standpoint of the color properties and high resolving power, it is preferably a color filter for solid-state imaging devices.

A solid-state imaging device having a color filter of three or more colors, including, for example, a blue color pattern, a green color pattern, and a red color pattern that is formed using the colored curable composition of the invention and has a reduced local increase in transmittance near 530 nm, has excellent color reproducibility of, in particular, a flesh color (skin color) in a printed image, when it is used for shooting an image.

The size (line width) of a color pattern (colored pixel) constituting the color filter of the invention is preferably 2.0 μm or less, and particularly preferably 1.7 μM or less from the standpoint of high resolving power.

The thickness of the color pattern is from 0.1 to 2.0 μm, and more preferably from 0.2 to 1.0 μm from the standpoint of high resolving power.

The color filter of the invention preferably includes a Bayer array color pattern (hereinafter, also called "Bayer pattern") from the standpoint of high resolving power.

In the invention, the Bayer array means an array in which regular squares are arranged in a checked pattern. The Bayer array is applied, for example, to green pixels in a color filter for solid-state imaging devices.

The method for producing the color filter of the invention is not particularly limited. For example, the color filter is favorably manufactured using a production method of the color filter of the invention described later.

Production Method of Color Filter

The method of producing the color filter of the invention is not particularly limited, but the production method of the color filter of the invention described below is suitable.

That is, the production method of the color filter of the invention at least includes applying the colored curable composition of the invention by coating on a support to form a colored layer (colored layer formation process), exposing the colored layer to light (exposure process), and developing the exposed colored layer (development process).

Hereinafter, respective processes in the production method of the invention are described.

Colored Layer Formation Process

In the colored layer formation process, the colored curable composition of the invention is applied on a support directly or via another layer by, for example, slit coating, and, according to need, drying the obtained coating film, to form a colored layer.

Examples of the support include alkali-free glass, soda glass, Pyrex (registered trade name) glass, quartz glass and products formed by adhering a transparent conductive film to these, which are used for liquid crystal display elements or the like; a substrate of optoelectronic conversion elements used for solid-state imaging devices and the like such as a silicon substrate and a plastic substrate. On these supports, usually, black matrix for isolating respective pixels are formed, or a transparent resin layer is provided for accelerating adhesion.

Plastic substrates preferably have a gas barrier layer and/or a solvent resistant layer on the surface thereof. In addition, it is also possible to form a patterned film constituted of the colored curable composition of the invention on a driving substrate on which a thin film transistor (TFT) of a TFT color liquid crystal display device is disposed (herein after, called "TFT liquid crystal driving substrate") to produce a color filter. In a photomask used on this occasion, a pattern for forming a through hole or a U-shaped concave are also provided in addition to the patterns for forming pixels. Examples of materials for the substrate of the TFT liquid crystal driving substrate include glass, silicon, polycarbonate, polyester, aromatic polyamide, polyamideimide, and polyimide. These substrates may be subjected to a suitable pretreatment, as required, such as a chemical treatment with a silane coupling agent or the like, a plasma treatment, ion plating, sputtering, a vapor phase reaction, or vacuum evaporation, before formation of a colored layer. For example, a substrate, in which a passivation film such as a silicon nitride film is formed on the surface of a TFT liquid crystal driving substrate, or to the surface of the driving substrate, is mentioned.

The method of applying the colored curable composition of the invention onto a support is not particularly limited, and a known coating method such as spin coating, slit coating, flow cast coating, roll coating, or bar coating is usable. Among these, the slit coating is preferable.

The slit coating is a method in which a slit nozzle is used (hereinafter, also called a slit nozzle coating method), and includes, for example, a slit-and-spin method and a spinless coating method.

In the slit nozzle coating method, the slit and spin coating method and the spinless coating method requires different conditions depending on the size of a substrate to be coated. For example, when coating is performed for a fifth generation glass substrate (1100 mm×1250 mm) by the spinless coating method, the ejection rate of the colored curable composition from a slit nozzle is, usually, from 500 to 2000 microliter/sec, preferably from 800 to 1500 microliter/sec, and the coating speed is, usually, from 50 to 300 mm/sec, preferably from 100 to 200 mm/sec. The solid content of the colored curable composition is, usually, from 10 to 20%, and preferably from 13 to 18%. When a coating film of the colored curable composition of the invention is formed on a substrate, the thickness of the coating film (after a prebake treatment) is, generally, from 0.3 to 5.0 µm, desirably from 0.5 to 4.0 and most desirably from 0.8 to 3.0 µm.

When the colored curable composition of the invention is applied to the formation of a color filter for high resolving power solid-state imaging devices, the film thickness is most preferably within the range from 0.4 to 2.0 µm.

The colored curable composition of the invention is particularly effective upon forming a thin colored film having a thickness of from 0.4 to 1.0 µm, or from 0.45 to 0.8 µm, for example.

Usually, a prebake treatment is performed after the coating. Before the prebake, according to need, a vacuum treatment may be performed. The conditions of vacuum drying are such that a vacuum degree is usually from 0.1 to 1.0 torr, and preferably around from 0.2 to 0.5 torr. The prebake treatment may be performed under such conditions as a temperature range from 50 to 140° C., preferably around from 70 to 110° C., for from 10 to 300 seconds, using a hot plate, an oven, or the like. A high-frequency treatment may be used in combination with the prebake. However, the high-frequency treatment may be used separately.

Exposure Process

In the exposure process, the colored layer formed in the colored layer formation process is subjected to exposure to light (preferably pattern exposure). The pattern exposure may be performed by a method of exposure through a mask having a desired mask pattern, or a method of scanning with a laser or the like.

In the exposure in the process, for example, the coating film is exposed to light through a desired mask pattern to cure only portions of the coating film, which are irradiated with light. After that, a developer is used to develop the film to remove uncured portions to form a color pattern (development process). These treatments are repeated for respective colors (three or four colors) to form a pattern-shaped film composed of pixels of respective colors.

As radiation usable upon the exposure, particularly, ultraviolet rays such as g-line or i-line are preferably used. An irradiation amount is preferably from 5 to 1500 mJ/cm$^2$, more preferably from 10 to 1000 mJ/cm$^2$, and most preferably from 10 to 500 mJ/cm$^2$.

When the color filter of the invention is used for the application of a liquid crystal display element, the irradiation amount is preferably from 5 to 200 mJ/cm$^2$, more preferably from 10 to 150 mJ/cm$^2$, and most preferably from 10 to 100 mJ/cm$^2$. Meanwhile, when the color filter of the invention is used for the application of a solid-state imaging device, the irradiation amount is preferably from 30 to 1500 mJ/cm$^2$, more preferably from 50 to 1000 mJ/cm$^2$, and most preferably from 80 to 500 mJ/cm$^2$.

When a color filter for solid-state imaging devices is produced, the formation of a high-resolution pattern is needed; therefore, it is preferable to mainly use i-line with a stepper exposure machine.

Development Process

The development process in the invention is a process of developing (development treating) the exposed colored layer.

In the development treatment, for example, uncured portions after the exposure are eluted into a developer so that only the cured portions are left. The development temperature at from 20 to 30° C. is usually preferable, and the development time for from 20 to 90 seconds is preferable.

Any developer may be used as long as it dissolves the coating film formed of the colored photocurable composition in uncured portions while not dissolving cured portions. Specifically, combinations of various organic solvents and alkaline aqueous solutions are usable.

Examples of the organic solvents include solvents usable upon preparing the pigment dispersion composition or the colored curable composition of the invention, which are described above.

Examples of the alkaline aqueous solutions include alkaline aqueous solutions formed by dissolving an alkaline compound such as sodium hydroxide, potassium hydroxide, sodium carbonate, sodium hydrogen carbonate, sodium silicate, sodium metasilicate, aqueous ammonia, ethylamine, diethylamine, dimethyl ethanolamine, tetramethylammonium hydroxide, tetraethylammonium hydroxide, choline, pyrrole, piperidine, or 1,8-diazabicyclo-[5,4,0]-7-undecene in water so as to give a concentration of from 0.001 to 10% by mass, and preferably from 0.01 to 1% by mass. To the alkaline aqueous solution, a water-soluble organic solvent such as methanol or ethanol, a surfactant, or the like may be added in an appropriate amount.

The development system is any of a dip system, a shower system, and a spray system, which may be combined with a swing system, a spin system, an ultrasonic system, or the like. It is also possible to previously wet the surface to be developed with water or the like before allowing the surface to contact a developer, to prevent unevenness of development. Further, the development may be performed while tilting the substrate.

When producing a color filter for solid-state imaging devices, a paddle development may be employed.

After the development treatment, a rinse process for washing and removing an excess developer, and drying are performed, and, after that, a heat treatment (postbake) is performed in order to make the curing complete.

In the rinse process, usually, pure water is used, but, for saving pure water, it is also possible to use pure water in the final washing, and to use secondhand pure water at the initial stage of washing, to wash a substrate in a tilt state, or to irradiate ultrasonic wave in combination.

After the rinse, water is drained, and the support is dried and subjected to a heat treatment, usually, at about from 200° C. to 250° C. The heat treatment (postbake) may be performed for the coating film after the development using a heating apparatus such as a hot plate, a convection oven (hot air circulating drier), or a high frequency wave heating machine so as to give the above conditions, in a continuous system or a batch system.

By repeating the operations for each of colors in turn in accordance with desired hue numbers, a color filter including the cured films having multiple colors may be produced.

Applications of the colored curable composition have been described while mainly focusing around the application to color filters, but the technique may also be applied to the formation of the black matrix isolating respective colored pixels constituting the color filter.

The black matrix may be formed by exposing and developing a pigment dispersion composition substantially similar to the pigment dispersion composition of the invention, except for using a black pigment such as carbon black or titanium black, and, after that, further subjecting the product, according to need, to postbake to accelerate the curing of the film.

Solid-State Imaging Device

The solid-state imaging device of the invention has at least the color filter of the invention.

The solid-state imaging device of the invention has at least the color filter of the invention having excellent color properties and high resolving power. Therefore, it is excellent in color properties (color reproducibility).

The solid-state imaging device having a color filter of three or more colors including, for example, a blue color pattern, a green color pattern, and a red color pattern that is produced using the colored curable composition of the invention and has a reduced local increase in transmittance near 530 nm provides excellent color reproducibility, particularly, of a flesh color (skin color) in printed images, upon shooting images.

The constitution of the solid-state imaging device of the invention is not particularly limited as long as the constitution has at least the color filter of the invention, and functions as a solid-state imaging device, including, for example, constitutions below.

For example, a color filter according an exemplary embodiment of the invention has a support; on the support, photodiodes constituting a light receiving area of a solid-state imaging device (such as a CCD image sensor, or a CMOS image sensor), and transfer electrodes constituted of polysilicon or the like; a light-shielding film constituted of tungsten or the like having openings only for light receiving portions of the photodiodes above the photodiode and the transfer electrode; a device protection film constituting of silicon nitride or the like on the light-shielding film so as to cover the whole area of the light-shielding film and light receiving portions of the photodiode; and the color filter of the invention on the device protection film.

Further, a constitution having a light condensing device or unit (such as a microlens, hereinafter the same) on the device protection film and under the color filter (the side nearer to the support), or a constitution having a light condensing device or unit on the color filter is also acceptable.

EXAMPLES

Hereinafter, the invention is described in more detail using Examples, but the invention is not limited to these Examples. Meanwhile, "part(s)," "%" and "molecular weight(s)" shows "part(s) by mass," "% by mass" and "weight average molecular weight(s)", respectively, unless otherwise specifically noted.

Example 1

1) Preparation of Undercoat Liquid

| | |
|---|---:|
| Propylene glycol monomethyl ether acetate (PGMEA) | 19.20 parts |
| Ethyl lactate | 36.67 parts |
| Binder [41% PGMEA solution of benzyl methacrylate/methacrylic acid/2-hydroxyethyl methacrylate copolymer (molar ratio = 60:20:20)] | 30.51 parts |
| Dipentaerythritol hexaacrylate (photopolymerizable compound) | 12.20 parts |
| Polymerization inhibitor (p-methoxyphenol) | 0.0061 part |
| Fluorine-containing surfactant (F-475, manufactured by Dainippon Ink And Chemicals) | 0.83 part |
| Photopolymerization initiator (TAZ-107 (trihalomethyl-triazine photopolymerization initiator), manufactured by Midori Kagaku) | 0.586 part |

These components were mixed and dissolved to prepare an undercoat liquid.

2) Production of Silicon Wafer Substrate Having Undercoat Layer

On a 6-inch silicon wafer, the undercoat liquid obtained in section 1) was uniformly applied by spin coating to form a coating film. The formed coating film was heat-treated on a hot plate at 120° C. for 120 seconds. Here, rotation number in the spin coating was adjusted so as to give the coating film thickness of about 2 μm after the heat treatment.

The coating film after the heat treatment was further treated in an oven at 220° C. for 1 hour to cure the coating film, thereby providing an undercoat layer.

In this way, a silicon wafer substrate having an undercoat layer, in which the undercoat layer was formed on a 6-inch silicon wafer, was obtained.

3) Preparation of Colored Curable Composition A-1

| | |
|---|---:|
| Benzyl methacrylate/methacrylic acid copolymer (moral ratio = 70/30) [binder polymer] | 2.64 parts |
| Compound MA-2 shown below [specific monomer] | 4.00 parts |
| Compound I-1 shown below [oxime photopolymerization initiator] | 0.5 part |
| Pigment dispersion liquid including Pigment Red 166 (solid content of 20% (containing 12% of pigment)) | 24.0 parts |
| Pigment dispersion liquid including Pigment Red 224 (solid content of 20% (containing 12% of pigment)) | 20.0 parts |
| Pigment dispersion liquid including Pigment Yellow 139 (solid content of 25.0% (containing 12% of pigment)) | 17.0 parts |
| Propylene glycol monomethyl ether acetate [solvent] | 16.7 parts |
| 3-Ethoxypropionic acid ethyl [solvent] | 17.9 parts |

These components were mixed with a stirrer to prepare a colored resist liquid (colored curable composition A-1) having a solid content of 15% by mass.

4) Production of Color Filter

On the undercoat layer of the silicon wafer substrate having the undercoat layer, the colored resist liquid obtained as described above was uniformly applied by spin coating to form a coating film. The formed coating film was heat-treated on a hot plate having a surface temperature of 100° C. for 120 seconds, thereby forming a colored resist layer. Here, rotation number in the spin coating was adjusted so as to give the coating film thickness of 1.0 μm after the heat treatment.

Next, using an i-line stepper (FPA-3000i5+, trade name, manufactured by Canon) as an exposure apparatus, the colored resist layer was subjected to pattern exposure with an exposure amount of 1500 J/m$^2$ through a photomask described later.

As the photomask, a photomask having a mask pattern, as shown in FIG. 1, in which square-shaped pixels having a side of 1.5 μm are arranged within the range of 3 mm×4 mm, was used.

The pattern-exposed colored resist layer was subjected to a paddle development using a 40% by mass aqueous solution of an organic alkaline developer, CD-2000 (trade name, manufactured by Fuji Film Electronics Materials) at room temperature for 60 seconds.

After the paddle development, rinse was performed by spin shower using pure water for 20 seconds, followed by washing with pure water for 20 seconds. After that, water drops remaining on the wafer was blown off by high-pressure air, then, the substrate was naturally dried, and, further, heat-treated on a hot plate having a surface temperature at 200° C. for five minutes, thereby forming a pattern of square-shaped pixels.

In this way, a color filter having the undercoat layer and patterns of square-shaped pixels in this order on a silicon wafer was obtained.

5) Evaluation

Spectral Properties (Transmittance at 530 nm)

The colored curable composition A-1 prepared as described above was applied on a glass substrate (Corning 1737) under conditions similar to those in the production of the color filter, and then heat-treated, thereby forming a colored resist layer for evaluation of spectral properties. The formed colored resist layer had a thickness of 1.0 µm.

The transmittance and absorbance of the obtained colored resist layer for evaluation of spectral properties were measured with a spectrophotometer (MCPD-2000).

Table 1 shows the obtained transmittance at 530 nm of the colored resist layer for evaluation of spectral properties.

Resolving Power

A color filter for examining resolving power was produced in a manner substantially similar to the manner in the production of the color filter described above, except that the photomask was changed to a photomask for examining resolving power, which has multiple types of square patterns having sides of variously different lengths, and that pattern exposure was performed at an exposure amount of 1500 J/m$^2$.

The formed color filter (color pattern) for examining resolving power was observed with a length measurement SEM (HITACHI S-9260S) at a magnification of 25,000 times, and the length of the side of a square pattern having a side of the shortest length among resolved square patterns was defined as the resolving power.

Development Residues

A length measurement SEM (HITACHI S-9260S) was used to observe marginal areas of the patterns and areas between the patterns of the square pixel patterns having a side of 1.5 µm, when the exposure amount was 1500 J/m$^2$, and to examine the generation of any adhering matter or undissolved matter, that is, development residues.

Table 1 shows the observation results of the generation of development residues.

Long-Term Stability of Viscosity (Dispersion Stability)

For a solution of the colored curable composition A-1, the long-term stability of viscosity was evaluated according to the evaluation criteria described below, by measuring respective viscosities before storage (initial viscosity), after storage at room temperature for one month, and after storage at 45° C for three days, with an E-type viscometer (manufactured by TOKI SANGYO CO., LTD.) Table 1 shows the evaluation results.

Evaluation Criteria

A: No increase in viscosity was observed.
B: Viscosity change of less than 5% was observed.
C: Viscosity change of from 5% or more to less than 10% was observed.
D: Viscosity change of 10% or more was observed.

Comparative Example 1

A colored curable composition of Comparative Example 1 was prepared in a manner substantially similar to that in Example 1, except that the "pigment dispersion liquid including Pigment Red 166" was not used, and that the same amount (mass) of Compound MA-1 was used in place of Compound MA-2. Then, a color filter was produced using the obtained colored curable composition, and was evaluated in a similar manner to that in Example 1.

Table 1 shows the evaluation results.

Comparative Example 2

A colored curable composition of Comparative Example 2 was prepared in a manner substantially similar to that in Example 1, except that the same amount (mass) of Compound MA-1 was used in place of Compound MA-2. Then, a color filter was produced using the colored curable composition, and was evaluated in a similar manner to that in Example 1.

Table 1 shows the evaluation results.

Comparative Example 3

A colored curable composition of Comparative Example 3 was prepared in a manner substantially similar to that in Example 1, except that 24.0 parts of a pigment dispersion liquid including Pigment Orange 38 (solid content of 20% (including pigment 12%)) was used in place of "24.0 parts of the pigment dispersion liquid including Pigment Red 166 (solid content of 20% (including pigment 12%))". Then, a color filter was produced using the colored curable composition, and was evaluated in a similar manner to that in Example 1.

Table 1 shows the evaluation results.

TABLE 1

| | (A) Monomer | (B) Binder polymer | (C) Photo-polymerization initiator | (D) Pigment | | | Spectral properties (transmittance at 530 nm) | Resolving power | Residue | Long-term viscosity stability (dispersion stability) |
|---|---|---|---|---|---|---|---|---|---|---|
| Exam 1 | MA-2 | BH-1 | I-1 | PR224 | PR166 | PY139 | 5.0% | 1.7 µm | None | A |
| Comp Ex 1 | MA-1 | BH-1 | I-1 | PR224 | None | PY139 | 14.0% | 1.7 µm | Slightly exist | A |
| Comp Ex 2 | MA-1 | BH-1 | I-1 | PR224 | PR166 | PY139 | 5.0% | 3.0 µm | Slightly exist | A |
| Comp Ex 3 | MA-2 | BH-1 | I-1 | PR224 | PO38 | PY139 | 4.4% | 3.0 µm | Slightly exist | D |

In Table 1, BH-1 represents benzyl methacrylate/methacrylic acid [mass ratio: 75/25, weight average molecular weight: 19,000].

In Table 1, Compound MA-1, Compound MA-2, and Compound I-1 have the following chemical structures, respectively.

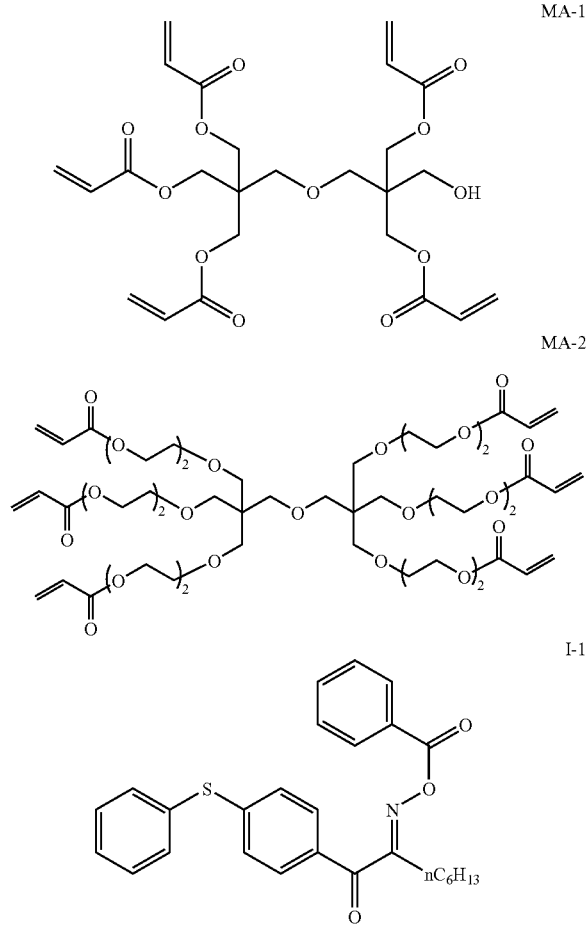

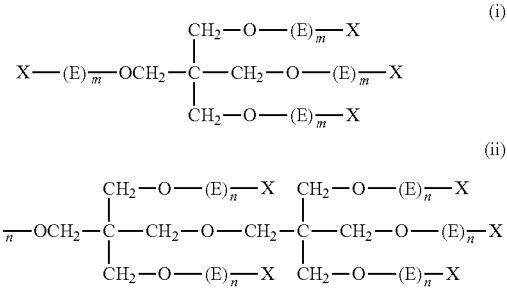

As shown in Table 1, the colored curable composition of Example 1 satisfies desired transmittance properties (i.e., can suppress the local increase in transmittance near 530 nm when formed into a red color filter), is excellent in resolving power, suppresses generation of development residues, and is excellent in long-term stability in viscosity.

The examples using the specific compound have been described. However, the same effects as those in Example 1 may also be obtained as long as the constitution of the invention is fulfilled, even when another compound than that described above is used.

Although the color filter was formed on a silicon wafer in the Example section, by changing the silicon wafer to a substrate for a solid-state imaging device to which a light-receiving element such as a photodiode is provided, it is possible to produce a solid-state imaging device excellent in color properties.

Specifically, images shot using a solid-state imaging device having a blue color pattern, a green color pattern, and the red color pattern formed using the photocurable composition of Example 1 has particularly excellent reproducibility of a flesh color (skin color), because a local increase in transmittance near 530 nm is suppressed in the red color pattern.

What is claimed is:

1. A colored curable composition, comprising:
a monomer having an alkyleneoxy chain;
a binder polymer;
a photopolymerization initiator; and
a pigment comprising Pigment Red 166.

2. The colored curable composition according to claim 1, wherein the pigment comprising Pigment Red 166 further comprises Pigment Red 224.

3. The colored curable composition according to claim 2, wherein the pigment comprising Pigment Red 166 further comprises a yellow pigment.

4. The colored curable composition according to claim 3, wherein the yellow pigment is Pigment Yellow 139.

5. The colored curable composition according to claim 1, wherein the pigment comprising Pigment Red 166 further comprises a yellow pigment.

6. The colored curable composition according to claim 5, wherein the yellow pigment is Pigment Yellow 139.

7. The colored curable composition according to claim 1, wherein the monomer having an alkyleneoxy chain comprises from 3 to 30 photocurable functional groups.

8. The colored curable composition according to claim 7, wherein each of the photocurable functional groups is a group having photo-radical reactivity.

9. The colored curable composition according to claim 7, wherein the monomer having an alkyleneoxy chain is represented by the following Formula (i) or the following Formula (ii):

$$X-(E)_{\overline{m}}-OCH_2-\underset{\underset{CH_2-O-(E)_{\overline{m}}-X}{|}}{\overset{\overset{CH_2-O-(E)_{\overline{m}}-X}{|}}{C}}-CH_2-O-(E)_{\overline{m}}-X \quad (i)$$

$$X-(E)_{\overline{n}}-OCH_2-\underset{\underset{CH_2-O-(E)_{\overline{n}}-X}{|}}{\overset{\overset{CH_2-O-(E)_{\overline{n}}-X}{|}}{C}}-CH_2-O-CH_2-\underset{\underset{CH_2-O-(E)_{\overline{n}}-X}{|}}{\overset{\overset{CH_2-O-(E)_{\overline{n}}-X}{|}}{C}}-CH_2-O-(E)_{\overline{n}}-X \quad (ii)$$

wherein, in Formula (i) and Formula (ii), each E independently represents $-((CH_2)_yCH_2O)-$ or $-((CH_2)_yCH(CH_3)O)-$, in which each y independently represents an integer of from 0 to 10; and each X independently represents an acryloyl group, a methacryloyl group, a hydrogen atom or a carboxyl group;

wherein, in Formula (i), the total number of acryloyl groups and methacryloyl groups is 3 or 4, each m independently represents an integer from 0 to 10, and the sum of the numbers represented by all m's is an integer from 2 to 40; and wherein, in Formula (ii), the total number of acryloyl groups and methacryloyl groups is 5 or 6, each n independently represents an integer from 0 to 10, and the sum of the numbers represented by all n's is an integer from 3 to 60.

10. A color filter, which is produced using the colored curable composition according to claim 1.

11. A solid-state imaging device, comprising the color filter according to claim 10.

12. A method of producing a color filter, comprising:
applying the colored curable composition according to claim 1 on a support to form a colored layer;
exposing the colored layer to light; and
developing the colored layer after the exposure.

* * * * *